United States Patent
Hosoya

(10) Patent No.: US 6,728,381 B1
(45) Date of Patent: Apr. 27, 2004

(54) NOISE REDUCING CIRCUIT

(75) Inventor: Nobukazu Hosoya, Nara (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 0 days.

(21) Appl. No.: 09/091,821

(22) PCT Filed: Dec. 24, 1996

(86) PCT No.: PCT/JP96/03774

§ 371 (c)(1),
(2), (4) Date: Jun. 25, 1998

(87) PCT Pub. No.: WO97/24803

PCT Pub. Date: Jul. 10, 1997

(30) Foreign Application Priority Data

| Dec. 27, 1995 | (JP) | ............................................. 7-341123 |
| Feb. 28, 1996 | (JP) | ............................................. 8-041418 |
| Mar. 7, 1996 | (JP) | ............................................. 8-049945 |
| Oct. 30, 1996 | (JP) | ............................................. 8-288368 |
| Oct. 30, 1996 | (JP) | ............................................. 8-288369 |
| Dec. 11, 1996 | (JP) | ............................................. 8-330496 |

(51) Int. Cl.[7] .......................... H04B 15/00; H04N 5/213
(52) U.S. Cl. ...................................... 381/94.1; 348/622
(58) Field of Search ....................... 381/94.3, 94.7; 348/622, 609, 98, 94.1

(56) References Cited

U.S. PATENT DOCUMENTS

| 4,709,269 A | * 11/1987 | Ozaki ........................ 348/622 |
| 4,908,581 A | * 3/1990 | Honjo ........................ 329/320 |
| 5,323,467 A | * 6/1994 | Hermes ..................... 381/94.3 |
| 5,444,787 A | * 8/1995 | Sakata ....................... 381/94.7 |
| 5,742,694 A | * 4/1998 | Eatwell ..................... 381/94.2 |
| 5,892,833 A | * 4/1999 | Maag et al. ................. 381/98 |

FOREIGN PATENT DOCUMENTS

| JP | 57-24173 | * 2/1982 |
| JP | 60-28433 | * 7/1985 |
| JP | 64-30371 | * 2/1989 |
| JP | 1-120176 | * 5/1989 |
| JP | 1-204573 | * 8/1989 |
| JP | 3-284067 | * 12/1991 |
| JP | 5-56309 | * 3/1993 |

* cited by examiner

*Primary Examiner*—Forester W. Isen
*Assistant Examiner*—Brian T. Pendleton
(74) *Attorney, Agent, or Firm*—Armstrong, Westerman & Hattori, LLP

(57) ABSTRACT

Predetermined frequency components contained in a luminance signal are extracted by BPF ($12a$)–($12n$), and amplified by limited amplifiers ($16a$)–($16n$). As a result, an addition signal, including a luminance signal component amplified and suppressed and a noise component amplified, is obtained from an adder ($20a$). The luminance signal is also supplied through an HPF (14) and adjusted in level by an amplifier (18). Therefore, a noise component is obtained from a subtracter ($20b$) by subtracting an amplified signal from the addition signal by a subtracter ($20b$). A subtracter ($20c$) subtracts this noise component from the luminance signal supplied from a delay circuit ($22a$), thereby outputting a luminance signal reduced of noise through an output terminal (S2). Because the luminance signal is separated into a plurality of bands by the plurality of BPFs, there is no possibility of saturating in noise component by the limiters, thus fully removing noise.

19 Claims, 41 Drawing Sheets

46a (46b~46n)

ative view showing passbands for a plurality of BPFs used in the FIG. 4 embodiment, while (B) is an illustrative view showing delay characteristics of the respective BPFs;

NOISE REDUCING CIRCUIT

TECHNICAL FIELD

This invention relates to noise reducing circuits, and more particularly to a noise reducing circuit adapted to reduce noise contained, for example, in an FM multiplex signal, a video signal reproduced by VTR, or a pickup-reproduced signal reproduced by a CD or DVD (Digital Video Disk) player.

BACKGROUND ART

In a conventional noise reducing circuit shown in FIG. 43, when a luminance signal is supplied through a high-pass filter (HFP) 2 and amplified by a limiter amplifier 3, an amplified signal, that is limited at a predetermined level and the higher as shown in FIG. 44B, is obtained from the limiting amplifier 3. Meanwhile, when a luminance signal shown in FIG. 44(A) is supplied through an HFP 4 and amplified by an amplifier 5, an amplified signal is obtained that has a maximum level nearly coincident with a limiting level of the limiter 3. The subtracter 6 subtracts an output of the amplifier 5 from an output of the limiter amplifier 3 to attenuate a level thereof, thereby outputting noise as shown in FIG. 44(D) from the subtracter 6. Accordingly, it is possible to reduce the noise contained in the luminance signal by subtracting the noise shown in FIG. 4(D) from the luminance signal shown in FIG. 44(A) with using the subtracter 6.

In this prior art, however, if a broad-band luminance signal is inputted, an extraction signal having a luminance signal component superposed with noise is obtained from the HPF 2. There has been a problem that noise is saturated by the limiter 3 with the result that no sufficient noise can be obtained from the subtracter 6.

Incidentally, there is another example of a noise circuit of this kind disclosed in Japanese Laying-open Patent Publication No. H2-239778 [H04N 5/21, G11P 20/02, H03H 15/00] that has been laid open on Sep. 21, 1990. According to FIG. 1 of this publication, when one or both of two switches is turned on, noise fallen on a passband of one or both of filters is supplied to a subtracter to thereby reduce noise from a reproduced signal. In such a noise removing filter, however, where any one of the two switches only is turned on, there arises, similarly to the above case, a problem that there is a saturation of noise superposed on a signal extracted from a corresponding filter. This problem still remains even where the both switches are turned on.

DISCLOSURE OF THE INVENTION

Therefore, it is a primary object of this invention to provide a noise reducing circuit that is capable of reducing noise contained in an input signal.

A first invention is a noise reducing circuit, comprising: a first signal path for receiving an input signal and outputting a noise component contained in the inputted signal; a second signal path for receiving the inputted signal and outputting the input signal or a first correlating signal correlating to the input signal; and a first calculating means for calculating the noise component outputted from the first signal path and the input signal or the first correlating signal outputted from the second signal path, and removing noise; wherein the first signal path includes a plurality of bandpass filters for extracting a plurality of first predetermined frequency components contained in the input signal, a plurality of limiters for individually receiving outputs of the bandpass filters, and a first creating means for creating the noise component based on outputs of the limiters.

A second invention is a noise reducing circuit, comprising a plurality of bandpass filters for extracting predetermined frequency components contained in an input signal; a plurality of amplifiers having a range in which a gain becomes zero or the slight with respect to an input level and having the predetermined frequency components; and an adding means for adding together input signal components contained in outputs of the amplifiers.

In the first invention, the noise component is outputted from the first signal path while the input signal or the first correlating signal correlating to the input signal is outputted from the second signal path. The first calculating means calculates the noise component and the first correlating signal to reduce the noise. In the first signal path, the bandpass filters divide the input signal into a plurality of bands to extract the predetermined frequency components. These first predetermined frequency components are individually given to the limiters where they are limited at a level higher than a predetermined level, i.e. the input signal is limited at a level higher than the predetermined level. The first creating means reduces, for example, input signal components contained in the outputs of the limiters to output a noise component.

In the second invention, the input signal is divided by the bandpass filters into a plurality of bands to extract the predetermined frequency components. These predetermined frequency components are individually given to amplifiers having a range of a gain of zero or the slight. Due to this, the noise contained in the predetermined frequency components is reduced. The outputs of the amplifiers are added together by the adding means, thereby obtaining an input signal reduced of the noise.

According to the first invention, since the input signal is divided by the bandpass filters into a plurality of bands, the noise contained in the input signal can be fully reduced without saturating the noise superposed on the extracted signal from the bandpass filter by the limiter.

According to the second invention, since the input signal is divided into a plurality of bands by the bandpass filters, it is possible to obtain the input signal fully reduced of the noise without amplification of the noise by the amplifier.

The above described objects and other objects, features, aspects and advantages of the present invention will become more apparent from the following detailed description of the present invention when taken in conjunction with the accompanying drawings.

BEST FORM FOR PRACTICING THE INVENTION

Figure 1:
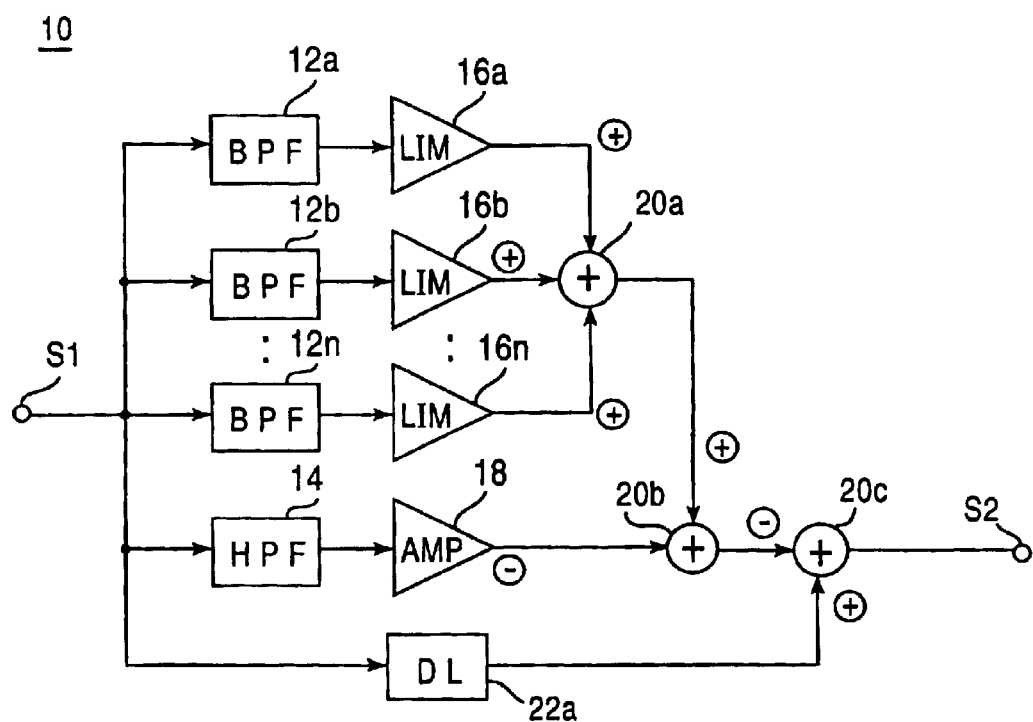
FIG. 1 is a block diagram showing one embodiment of this invention.
Figure 2A:
FIG. 2 is a timing chart showing part of operation in the FIG. 1 embodiment.
Figure 2B:
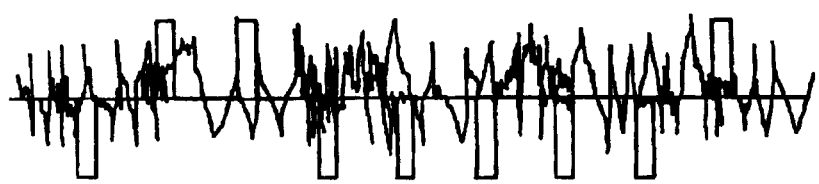

Referring to FIG. 1, a noise reducing circuit 10 of this embodiment includes an input terminal S1 to receive a video signal, i.e., luminance signal, reproduced by a VTR (not shown) as shown in FIG. 2(A). This video signal is supplied to a plurality of bandpass filters (BPF) 12a–12n and a high-pass filter (HPF) 14. The BPFs 12a–12n respectively extract predetermined frequency components contained in the video signal, while the HPF 14 extracts a high-range component of the video signal. The extracted signals extracted by the BPFs 12a–12n are respectively inputted to limiter amplifiers 16a–16n where the extracted signals are amplified and the amplified signals are then limited at its predetermined level portion or the higher. The limiter amplifiers 16a–16n have respective outputs added together by an adder 20a, thereby providing a signal that is amplified in noise component and suppressed in luminance signal component as shown in FIG. 2(B).

Figure 2C:
Figure 2D:
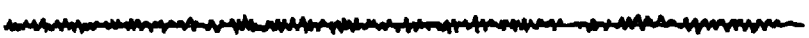
Figure 2E:
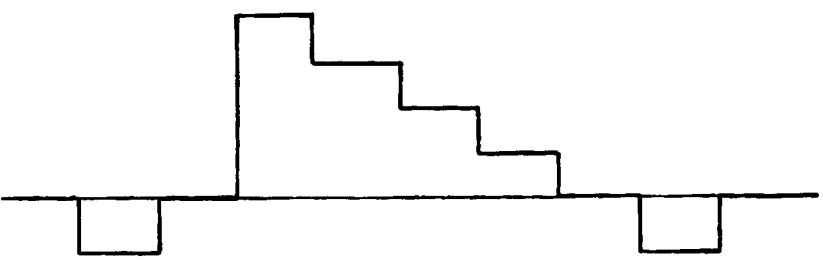

On the other hand, an output of the HPF 14 is amplified by an amplifier 18, thereby providing an amplified signal having a maximum level nearly coincident with a limiting level of the limiter amplifiers 16a–16n as shown in FIG. 2(C). The addition signal from the adder 20a and the amplification signal from an amplifier 18 are supplied to an subtracter 20b where the luminance signal component are removed from the addition signal shown in FIG. 2(B). The subtracter 20b outputs a noise component attenuated in level to a noise component contained in the input signal supplied through the input terminal S1. The luminance signal inputted through the input terminal S1 is also matched in phase with this noise component by a delay circuit 22a as a second delay means, and supplied to a subtracter 20c. The subtracter 20c subtracts an output of the adder 20b from an output of the delay circuit 22a, with a result that a luminance signal reduced of a noise component as shown in FIG. 2(E) is outputted through an output terminal S2.

Figure 3:
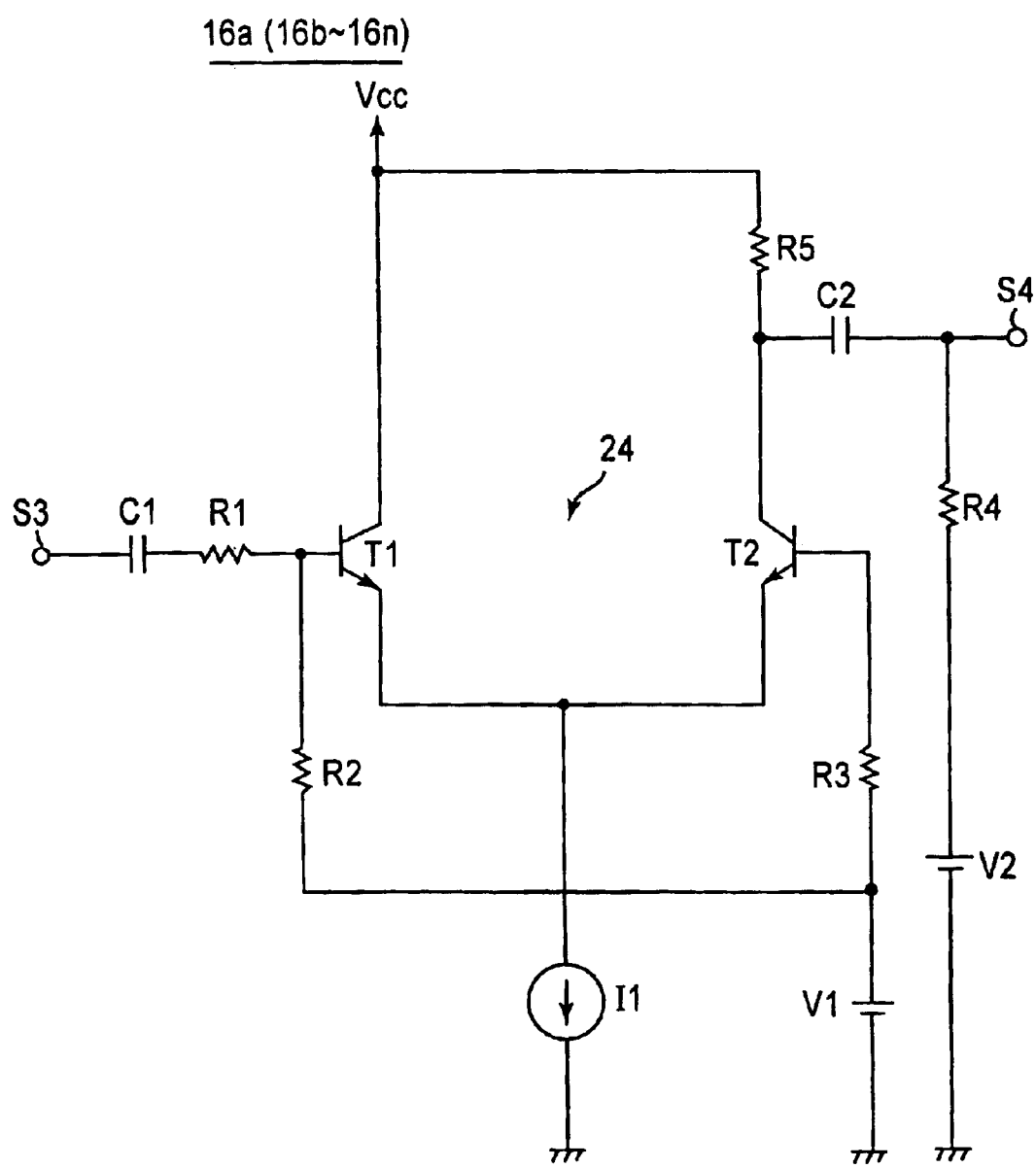
FIG. 3 is a circuit diagram showing a limiter employed in the FIG. 1 embodiment.

The limiter amplifiers 16a–16n are structured as shown in FIG. 3. That is, an input terminal S3 is connected through a capacitor C1 and resistor R1 to a base of a transistor forming a differential pair 24. The base of the transistor T1 is connected to a base of a transistor T2 through resistors R2 and R3. The resistors R2 and R3 have a connecting point connected to a constant-voltage source V1. The transistor T1 has a collector connected to a power supply VCC. A constant-current source 11 is connected to a connecting point between an emitter of the transistor T1 and an emitter of the transistor T2. The transistor T2 has a collector connected to the power supply VCC through a resistor R5, and to an output terminal S4 through a capacitor C2. The capacitor C2 and the output terminal S4 has therebetween a connecting point connected to a constant-voltage source V2 through a resistor R4.

Accordingly, an output level decreases as a resistance value of the resistance R5 increases, while the output level increases as the resistance value decreases. Meanwhile, a limiter level is varied by changing the ratio of the resistors R1 and R2. That is, the limiter level increases with decrease in the resistance value of the resistor R1, while the limiter level decreases with increase in the resistance value. Due to this, an amplified signal containing an increased noise component can be obtained by adjusting the registers R1, R2 and R5.

Meanwhile, the amplifier 18 is similarly structured to the limiter amplifiers 16a–16n, wherein an amplified signal free of limiting can be obtained by considerably decreasing the value of the resistor R1.

Figure 4:
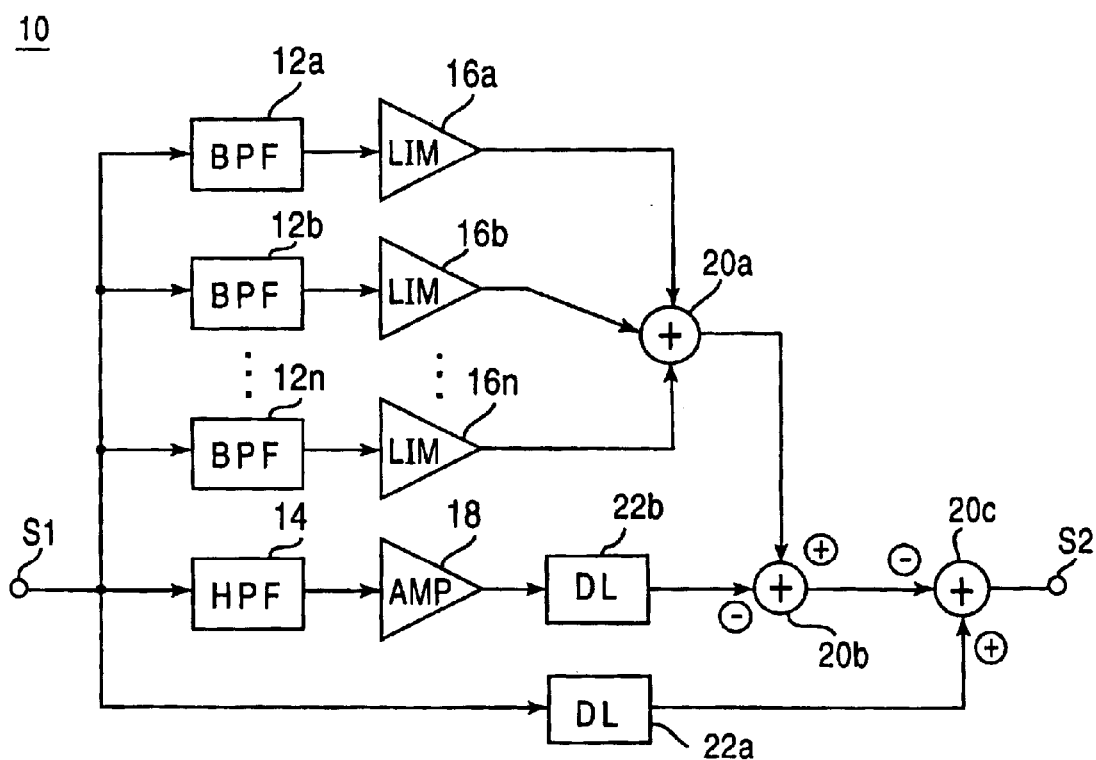
FIG. 4 is a block diagram showing another embodiment of this invention.
Figure 5A:
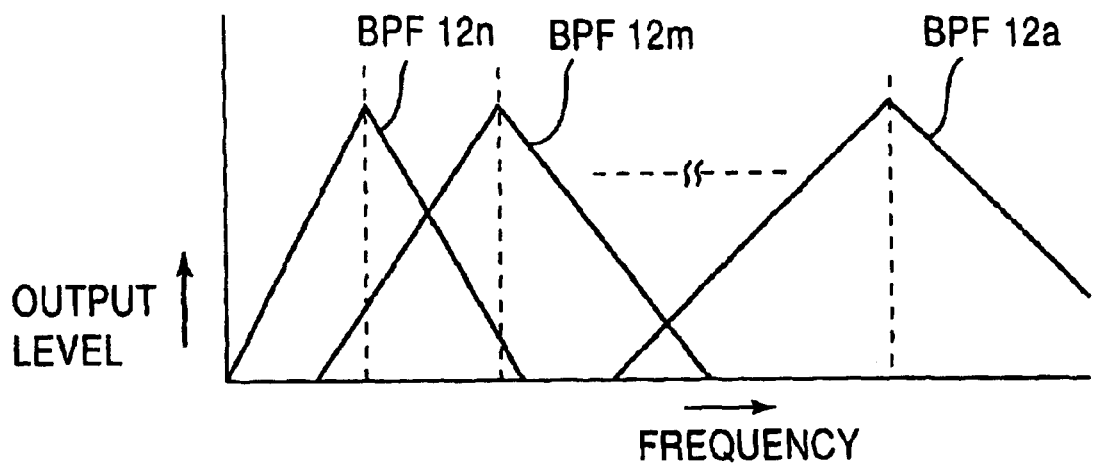
FIG. 5(A) is an illustrative view showing passbands for a plurality of BPFs used in the FIG. 4 embodiment, while (B) is an illustrative view showing delay characteristics of the respective BPFs.
Figure 5B:
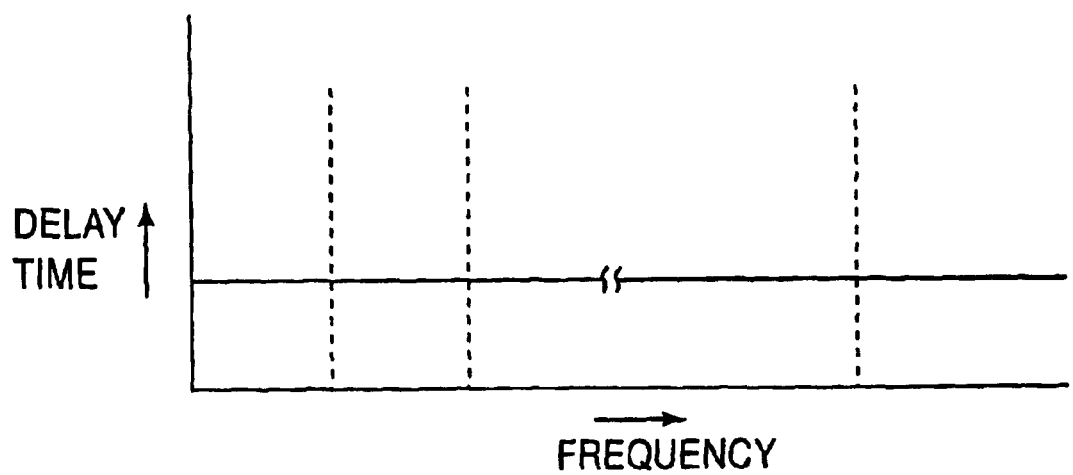

Referring to FIG. 4, a noise reducing circuit 10 in another embodiment is same as the FIG. 1 embodiment except that a delay circuit 22 as a first delay means is inserted between the amplifier 18 and the subtracter 20b, and the BPFs 12a–12n have a pass-band width as shown in FIG. 5(A), omitting duplicated explanations. The BPFs 12a–12n have a pass-band width corresponding to their own delay characteristics. That is, the delay time caused by extraction in the BPF increases with increase in passing-frequency band provided that the pass-band width is the same. Accordingly, if the pass-band width of the BPFs 12a–12n is broadened with increase in the pass-frequency band as shown in FIG. 5(A), the delay characteristic of the BPFs 12a–12n can be flattened as shown in FIG. 5(B).

On the other hand, the delay time of the delay circuit 22b is set that such that the luminance signal outputted from the amplifier 18 is coincident in phase with the luminance signal component contained in the addition signal outputted from the adder 20a. This positively removes the luminance signal component from the addition signal with a result that a luminance signal reduced of noise component is obtained through the output terminal S2.

Figure 6:
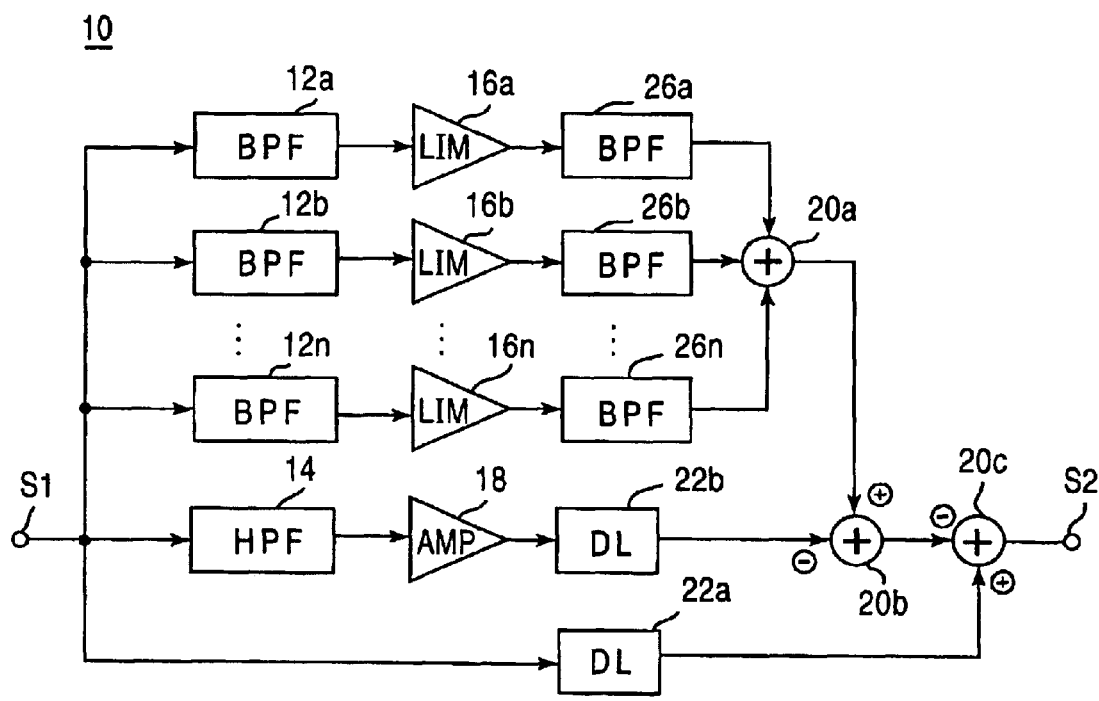
FIG. 6 is a block diagram showing a further embodiment of this invention.

Referring to FIG. 6, a noise reducing circuit in another embodiment is similar to the FIG. 4 embodiment except that a plurality of BPFs 26a–26n are inserted between the adder 20a and the respective limiter amplifiers 16a–16n, omitting duplicated explanations. The BPFs 26a–26n serve to remove of n-order higher harmonics occurring from the limiter amplifiers 16a–16n, because there is a fear of beat occurrence between n-order higher harmonics caused by the limiter amplifiers 16a–16n and n-order higher harmonics contained in any of the extracted signal. Also each of the BPFs 26a–26n is wider in pass-band width than any of the BPFs 12a–12n. Consequently, there is no possibility of deviation in delay time between BPFs 26a–26n.

Figure 7:
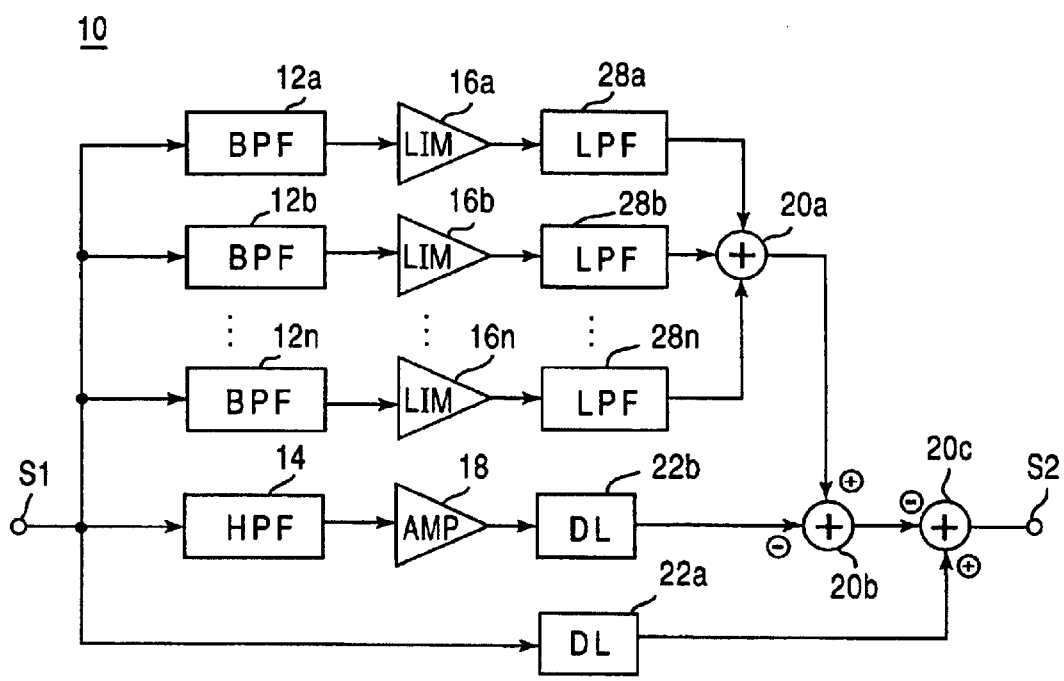
FIG. 7 is a block diagram showing still another embodiment of this invention.

Referring to FIG. 7, a noise reducing circuit 10 in still another embodiment is similar to the FIG. 6 embodiment except that the BPF 26a–26n are replaced by low-pass filters (LPF) 28a–28n. These LPFs 28a–28n are also filters to remove the n-order higher harmonics caused by the limiter amplifiers 16a–16n, which prevent beat from occurring. The respective LPFs 28a–28n are same in cut-off frequency at a range lower than the higher harmonics. Thus, there is no possibility of deviation in delay characteristics between the LPFs 28a–28n.

Figure 8:
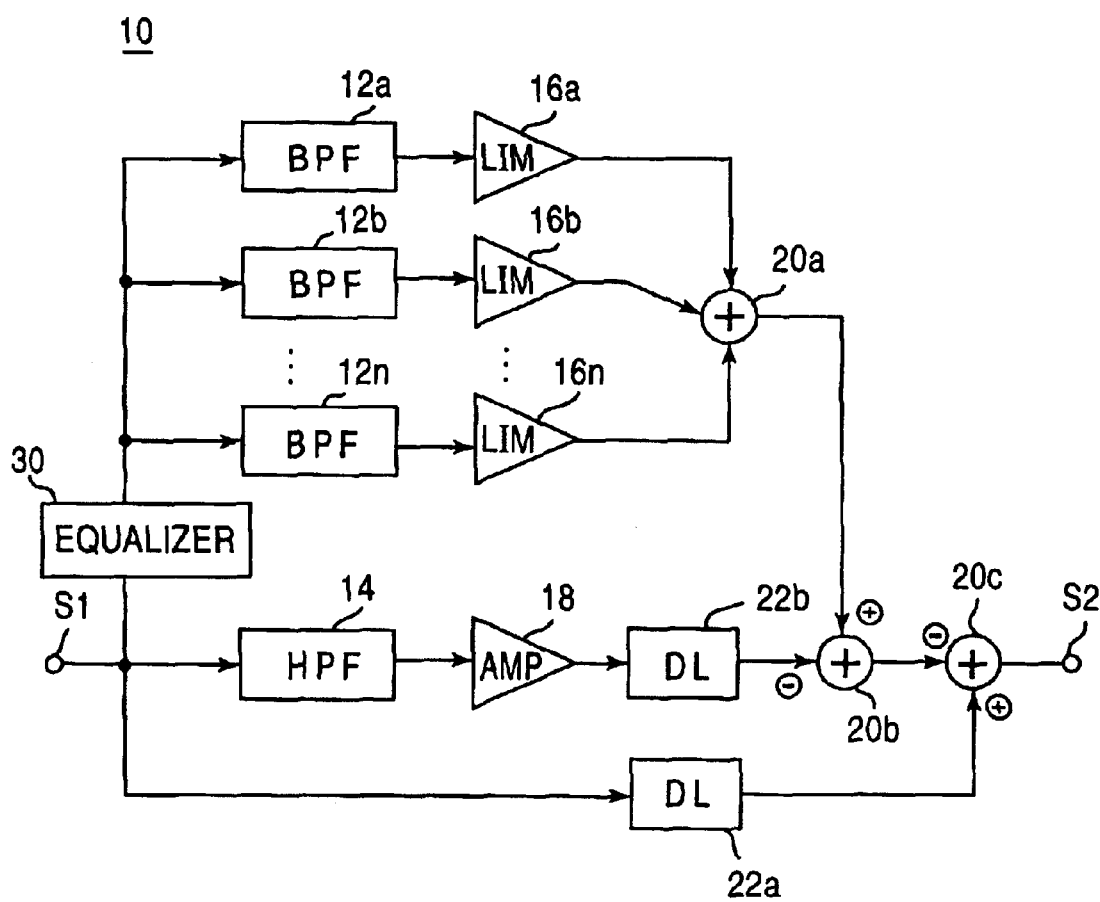
FIG. 8 is a block diagram showing another embodiment of this invention.
Figure 9A:
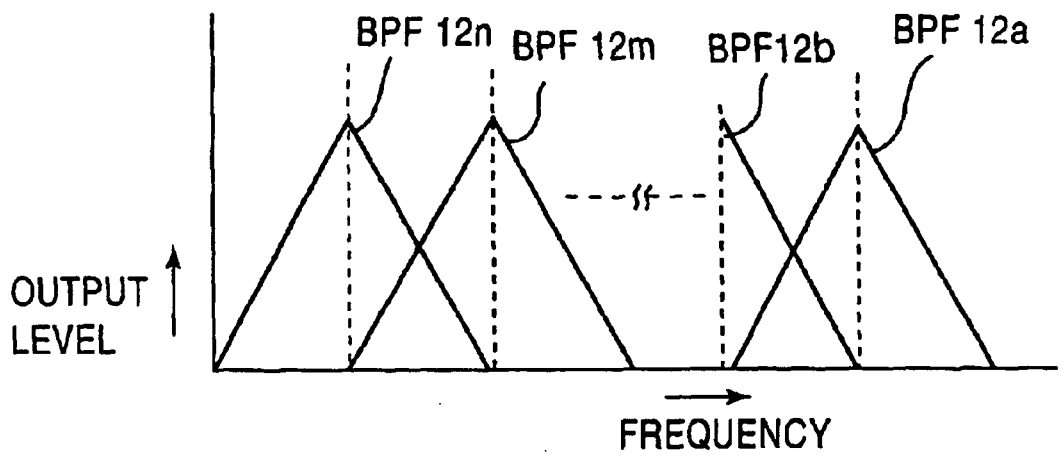
FIG. 9(A) is an illustrative view showing passbands for a plurality of BPFs used in the FIG. 8 embodiment, while (B) is a graph showing delay characteristics of the respective BPFs.
Figure 9B:
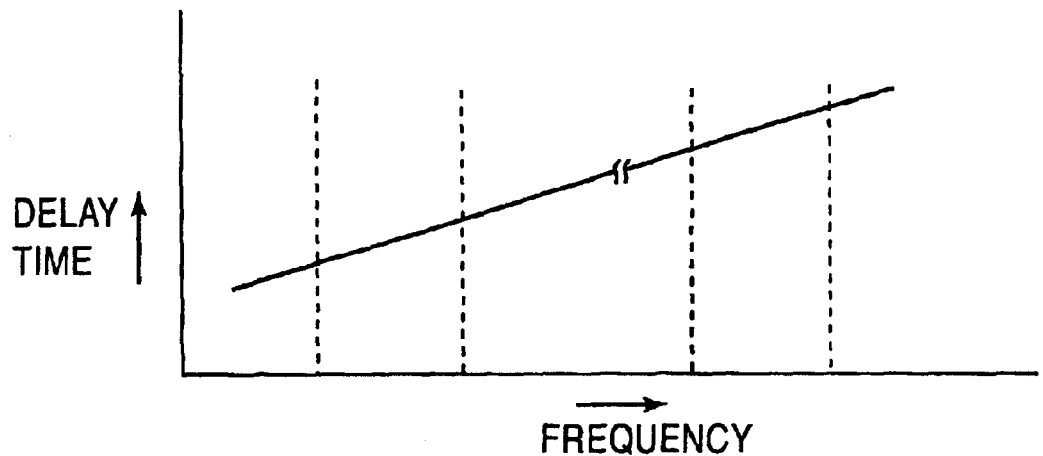

Referring to FIG. 8, a noise reducing circuit 10 in still another embodiment is similar to the FIG. 4 embodiment except that the BPFs 12a–12n have a pass-band width as shown in FIG. 9(A) and further an equalizer 30 is inserted between the BPFs 12a–12n and the input terminal S1. The equalizer 30 causes the predetermined frequency components extracted by the BPFs 12a–12n to deviate in phase by a predetermined amount. Since the BPFs 12a–12n are same in pass-band width, there is tendency toward deviation of delay characteristic as shown in FIG. 9(B). However, the provision of the equalizer 30 brings, the predetermined frequency components outputted from the BPFs 12a–12n into a same phase. Also, the BPFs 12a–12n may use elements common to one another, thus facilitating the design.

Figure 10:
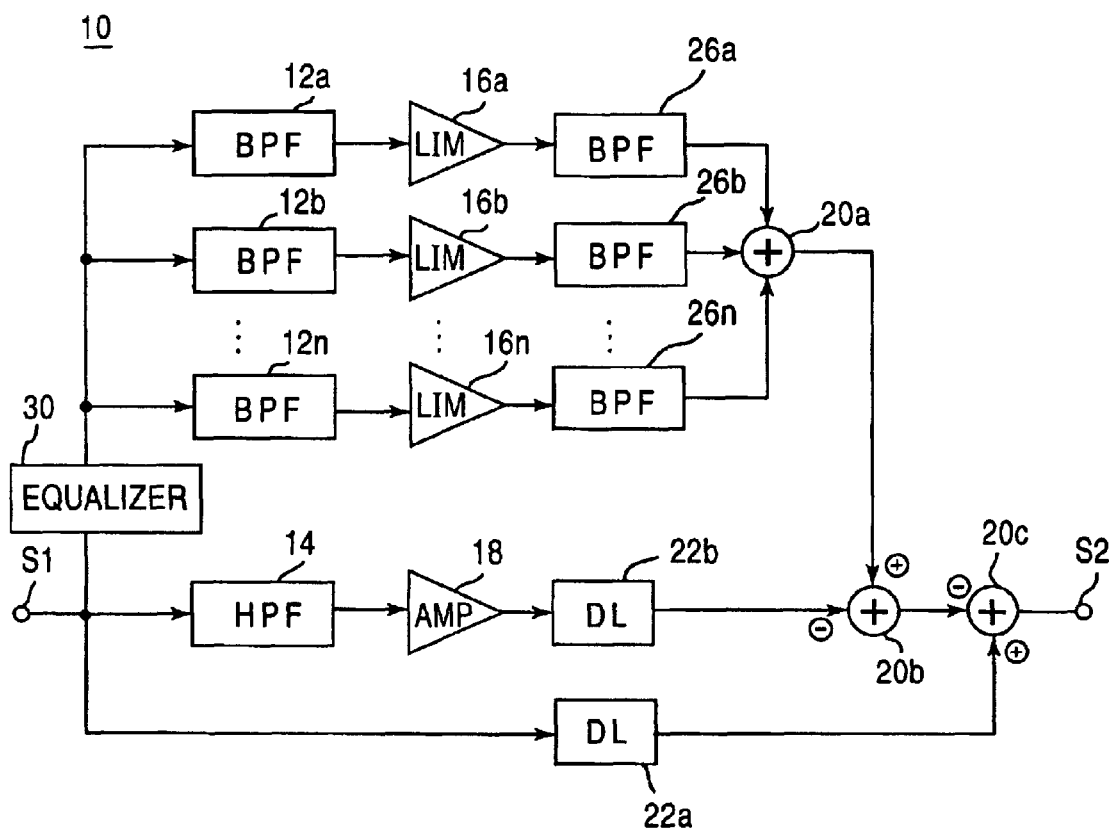
FIG. 10 is a block diagram showing another embodiment of this invention.
Figure 11:
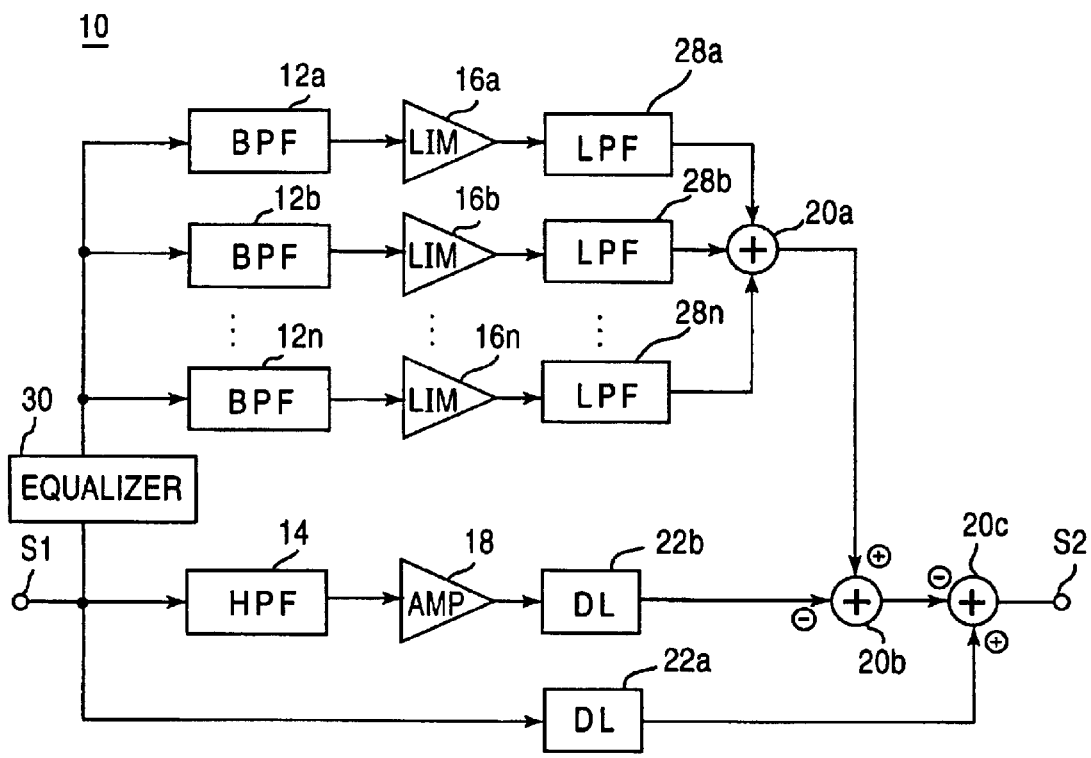
FIG. 11 is a block diagram showing a further embodiment of this invention.

Referring to FIG. 10, a noise reducing circuit 10 in another embodiment is similar to the FIG. 8 embodiment except that the BPFs 26a–26n having used in the FIG. 6 embodiment are respectively inserted between the limiter amplifiers 16a–16n and the adder 20a. The noise reducing circuit 10 thus structured can remove n-order higher harmonics caused by the limiter amplifiers 16a–16n. Incidentally, the BPFs 26a–26n may be replaced by the LPF 28a–28n used in the FIG. 7 embodiment, as shown in FIG. 11.

Figure 12:
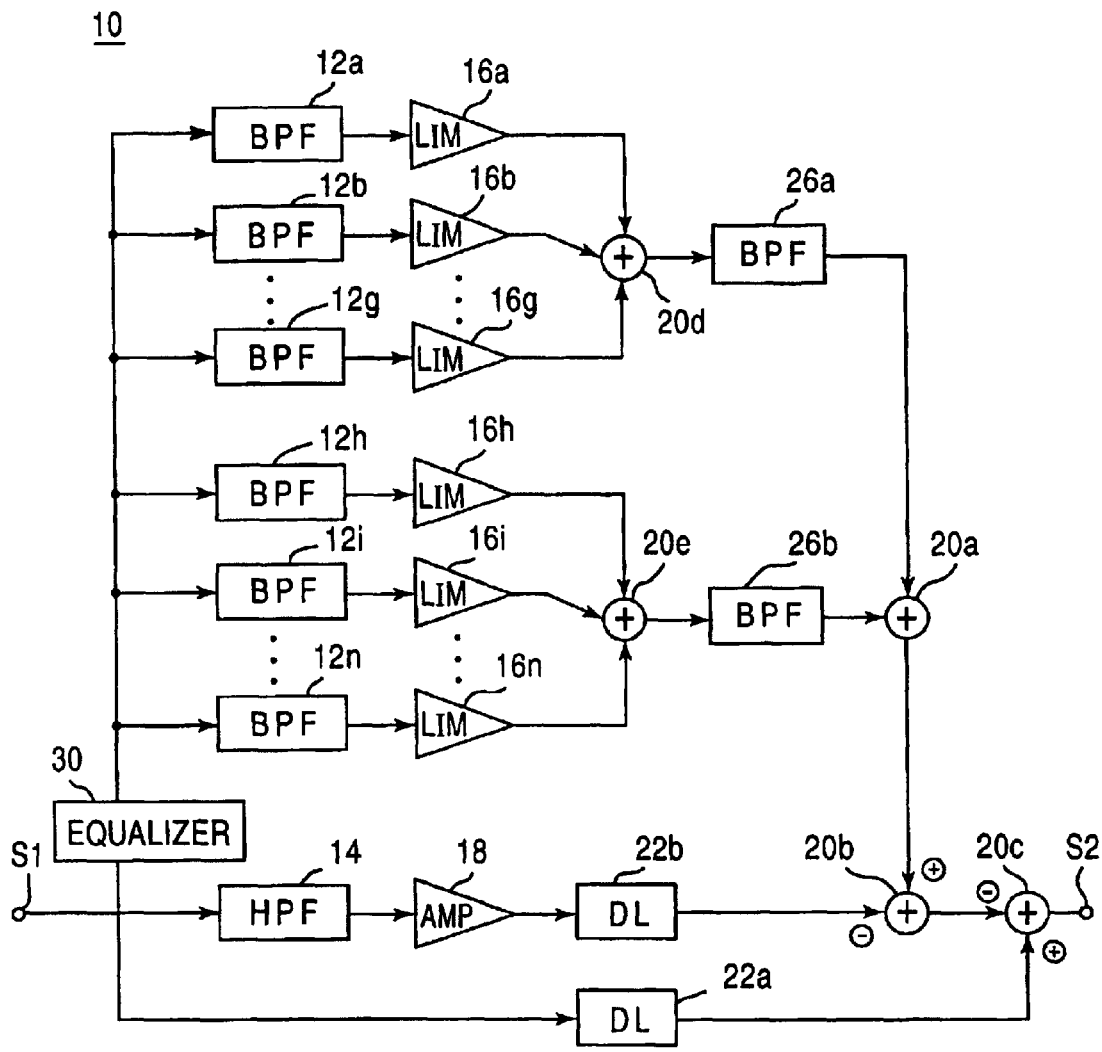
FIG. 12 is a block diagram showing still another embodiment of this invention.
Figure 13:
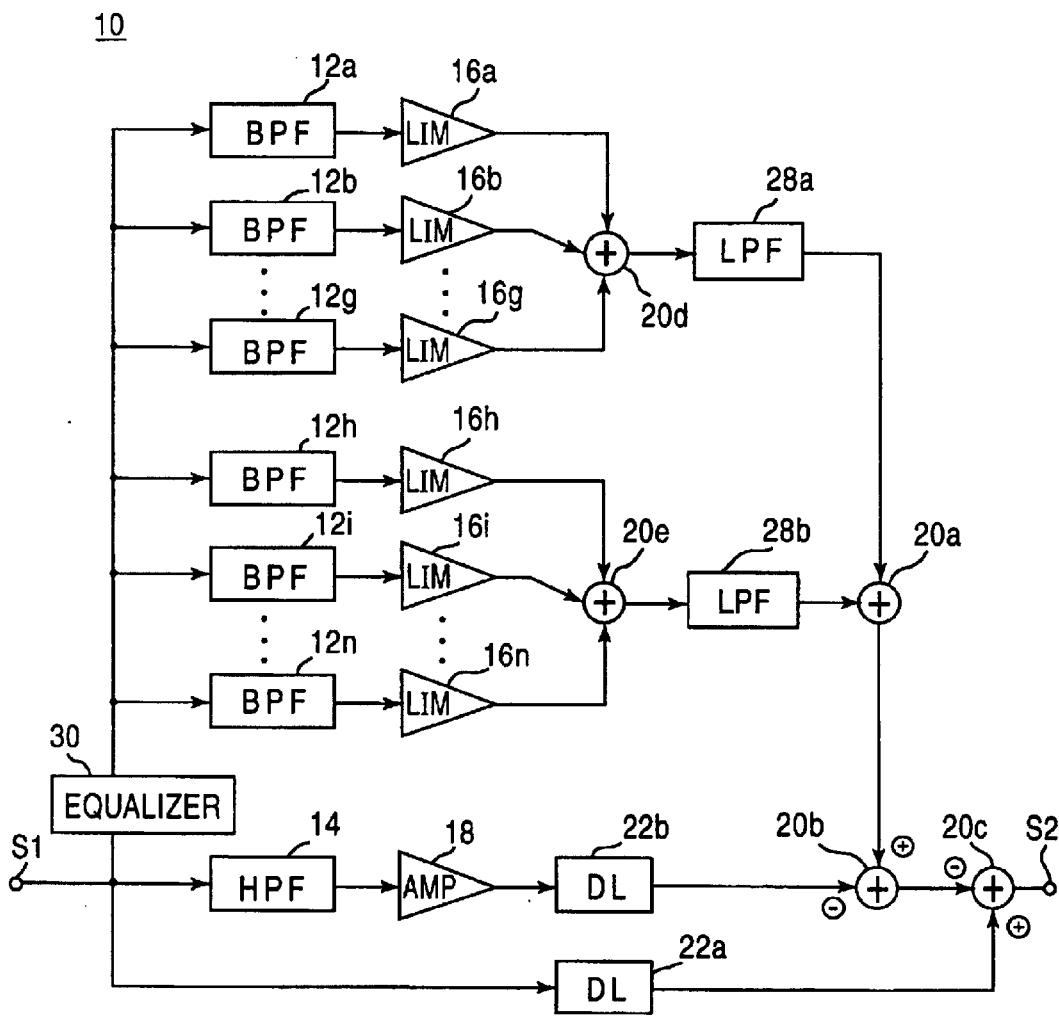
FIG. 13 is a block diagram showing another embodiment of this invention.

A noise reducing circuit 10 in an still another embodiment shown in FIG. 12 is similar to the FIG. 8 embodiment except that the outputs of limiter amplifiers 14a–14g are added by the adder 20d and the outputs of the limiter amplifiers 14h–14n are added by an adder 20e so that the outputs of the adders 20d and 20e are respectively inputted to BPF 26a–26b, omitting duplicated explanation. The provision of the adders 20d and 20e like this can greatly reduce the number of the BPF used to remove the n-order higher harmonics caused by the limiter amplifiers 14a–14n. As shown in FIG. 13, the BPF 26a and 26b in the FIG. 12 embodiment may be substituted by LPF 28a and 28b.

Figure 14:
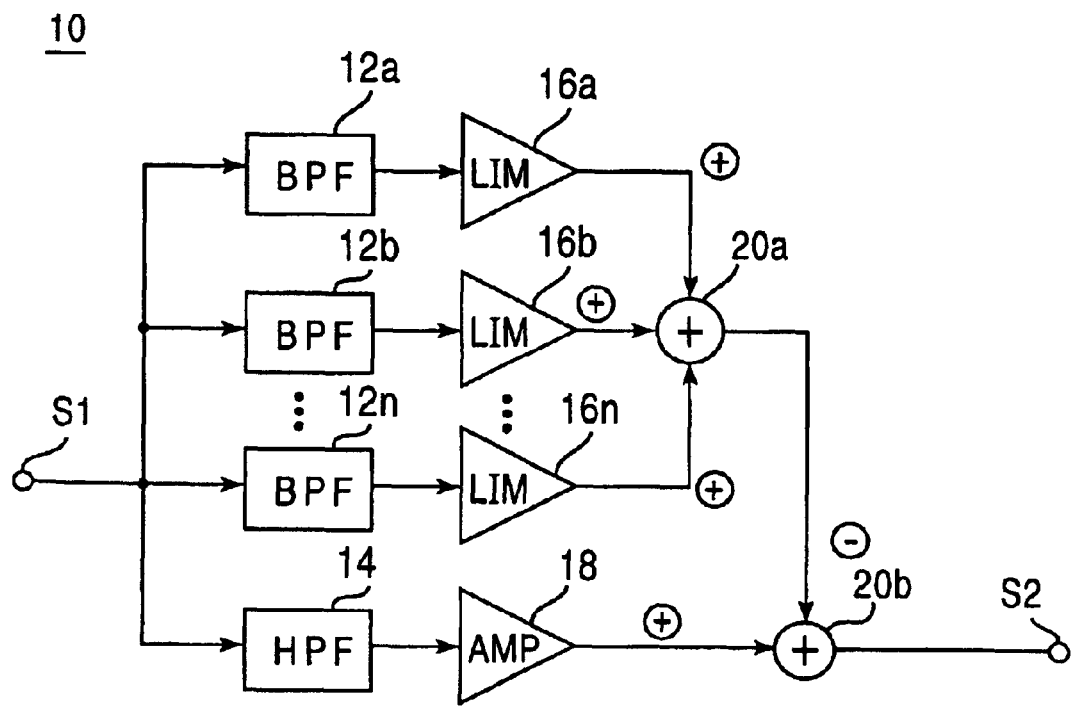
FIG. 14 is a block diagram showing still another embodiment of this invention.
Figure 15A:
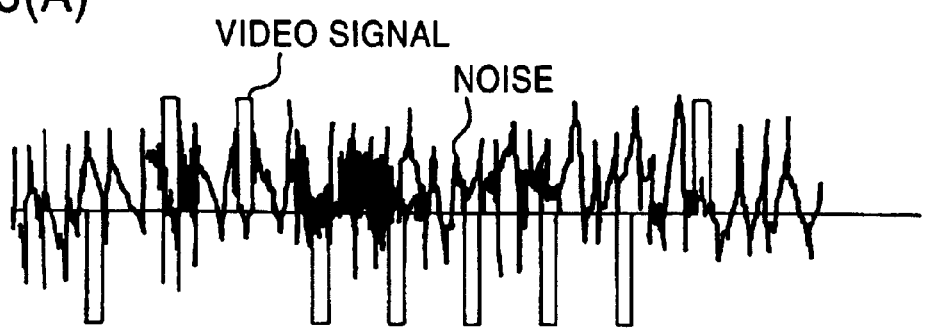
FIG. 15 is a timing chart showing part of operation in the FIG. 14 embodiment.
Figure 15B:
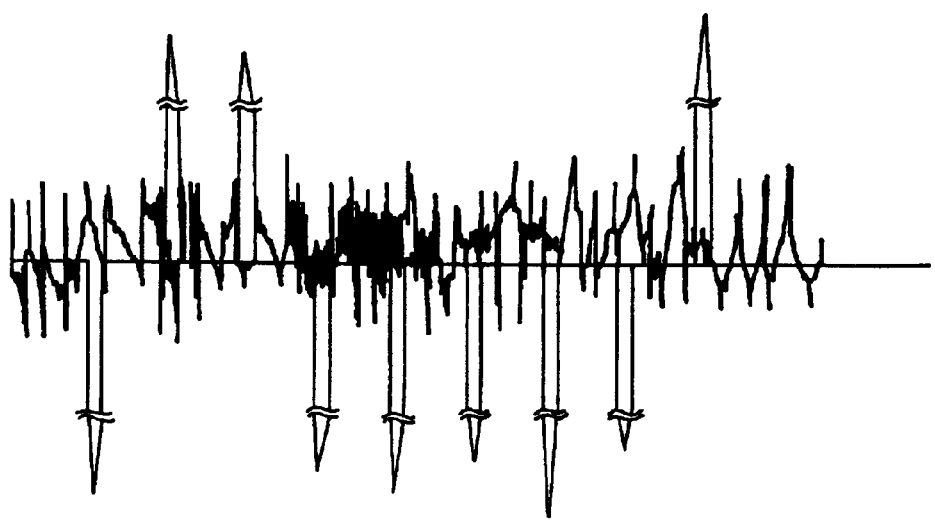

Referring to FIG. 14, a noise reducing circuit 10 in another embodiment is similar to the FIG. 1 embodiment except that the delay circuit 22a and the subtracter 20c are omitted, a luminance signal not containing a low frequency is inputted through the input terminal S1, the amplifier 18 has a same amplification as the limiter amplifiers 16a–16n without level limitation different from the limiter amplifiers 16a–16n, and the subtracter 20b subtracts the output of the adder 20a from the output of the amplifier 18. The limiter amplifiers 16a–16n has outputs that are added 20a so that the adder 20a provides an addition signal amplifier and containing a suppressed luminance signal component and an amplified noise component, as shown in FIG. 15(A). From the amplifier 18, an amplifier 18, an amplified signal as shown in FIG. 15(B) is obtained. The subtracter 20a subtracts the amplified signal by the addition signal to attenuate in level the subtraction signal, thereby obtaining a luminance signal reduced of a noise component through the output terminal S2.

Figure 16:
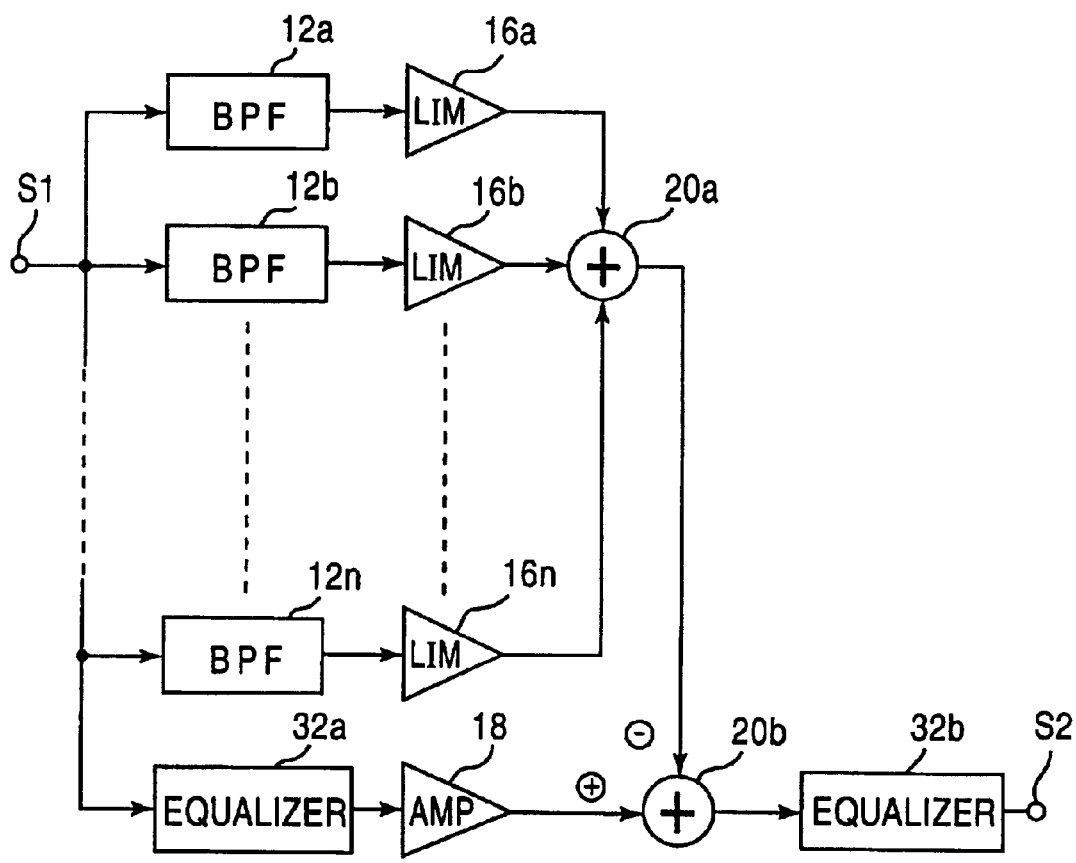
FIG. 16 is a block diagram showing another embodiment of this invention.
Figure 17:
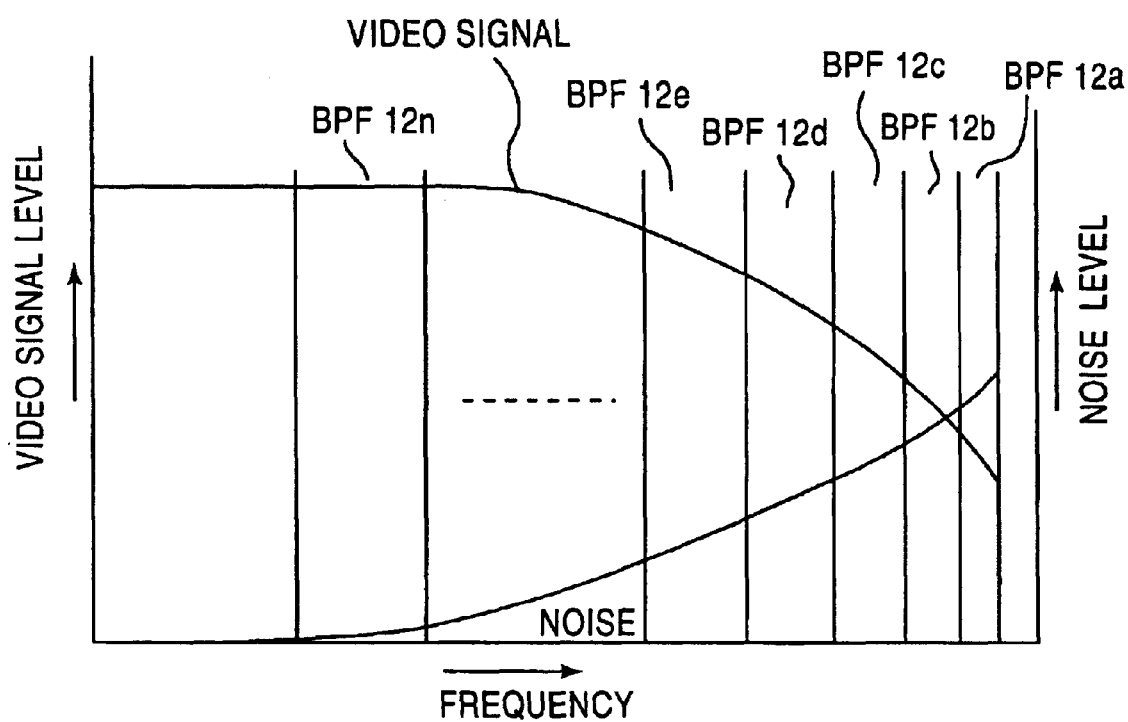
FIG. 17 is a graph showing frequency characteristics of a video signal and noise.

Referring to FIG. 16, a noise reducing circuit 10 in a further embodiment is similar to the FIG. 14 embodiment except that the BPFs 12a–12n have a pass-band width as shown in FIG. 17, the amplifier 18 has, at a front stage, an equalizer 32a to deviate in phase the respective predetermined frequency components extracted by the BPFs 12a–12n, and the subtracter 20b has, at a rear stage, an equalizer 32b to return the phase deviated by the equalizer 32a. As understood from FIG. 17, the luminance signal supplied to the input terminal S1 decreases in level as the frequency increases, while the level of a noise contained in the luminance signal increases as the frequency increases. Consequently, if the pass-band width of the BPFs 12a–12n is narrowed as the pass-frequency range becomes higher, i.e.

as the noise level at the pass-band increases, the respective noise components obtainable from the BPFs 12a–12n are brought into almost a same level. The BPFs 12a–12n have their outputs amplified by limiter amplifiers 16a–16n. Thereafter, the outputs of the limiter amplifiers 16a–16n are added together by the adder 20a.

On the other hand, in the equalizer 32, the predetermined frequency components contained in the luminance signal and correspond to pass-bands of the BPF 12a–12n are adjusted in phase corresponding to the delay time caused by the BPF 12a–12n so that a predetermined frequency component adjusted in phase is supplied to the subtracter 20b through the amplifier 18. Accordingly, the output of the adder 20a is subtracted from the output of the amplifier 18 by the subtracter 20b, thereby removing positively a noise component contained in the output of the amplifier 18. The output from the subtracter 20b is supplied to the equalizer 32b having a reverse characteristic to the equalizer 32a, thereby correcting the deviations in phase of the predetermined frequency components. Incidentally, if the BPF 12a–12n are made narrower in pass-band width as the pass frequency range becomes higher, the number of the BPFs can be reduced minimum.

Figure 18:
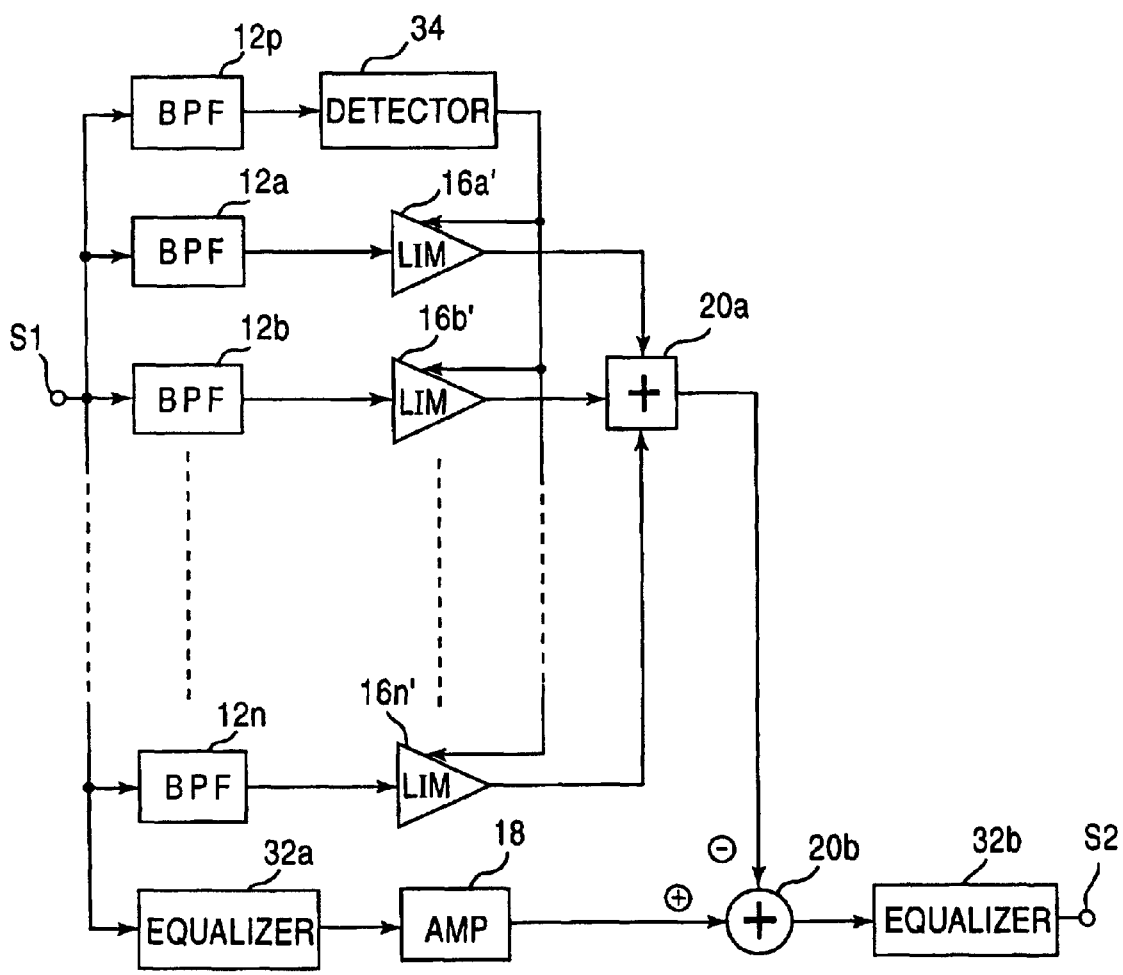
FIG. 18 is a block diagram showing another embodiment of this invention.

Referring to FIG. 18, a noise reducing circuit 10 in another embodiment is similar to the FIG. 16 embodiment except that a BPF 12p is added that has the same pass-band as the BPF 12a and a level detector 34 for detecting a level of an extracted signal extracted by the BPF 12p, and the limiter amplifiers 16a–16n are replaced by limiter amplifiers 16a'–16n' controllable by a detection signal supplied from the level detector 34. The extracted signal from the BPF 12p is detected in level by the level luminance signal inputted through the input terminal S1. Due to this, the limiter amplifiers 16a'–16n' can be adjusted in limiting level to optimal values.

Figure 19:
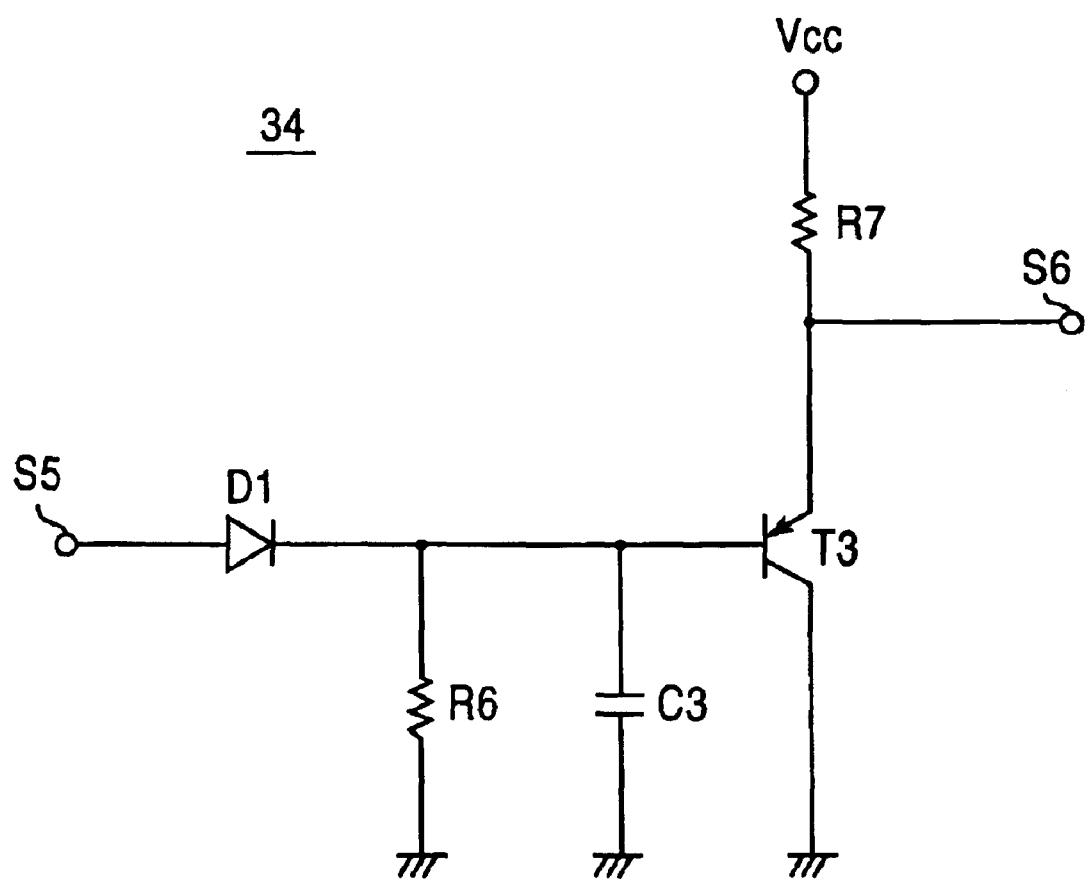
FIG. 19 is a circuit diagram showing a level detector used in the FIG. 18 embodiment.
Figure 20:
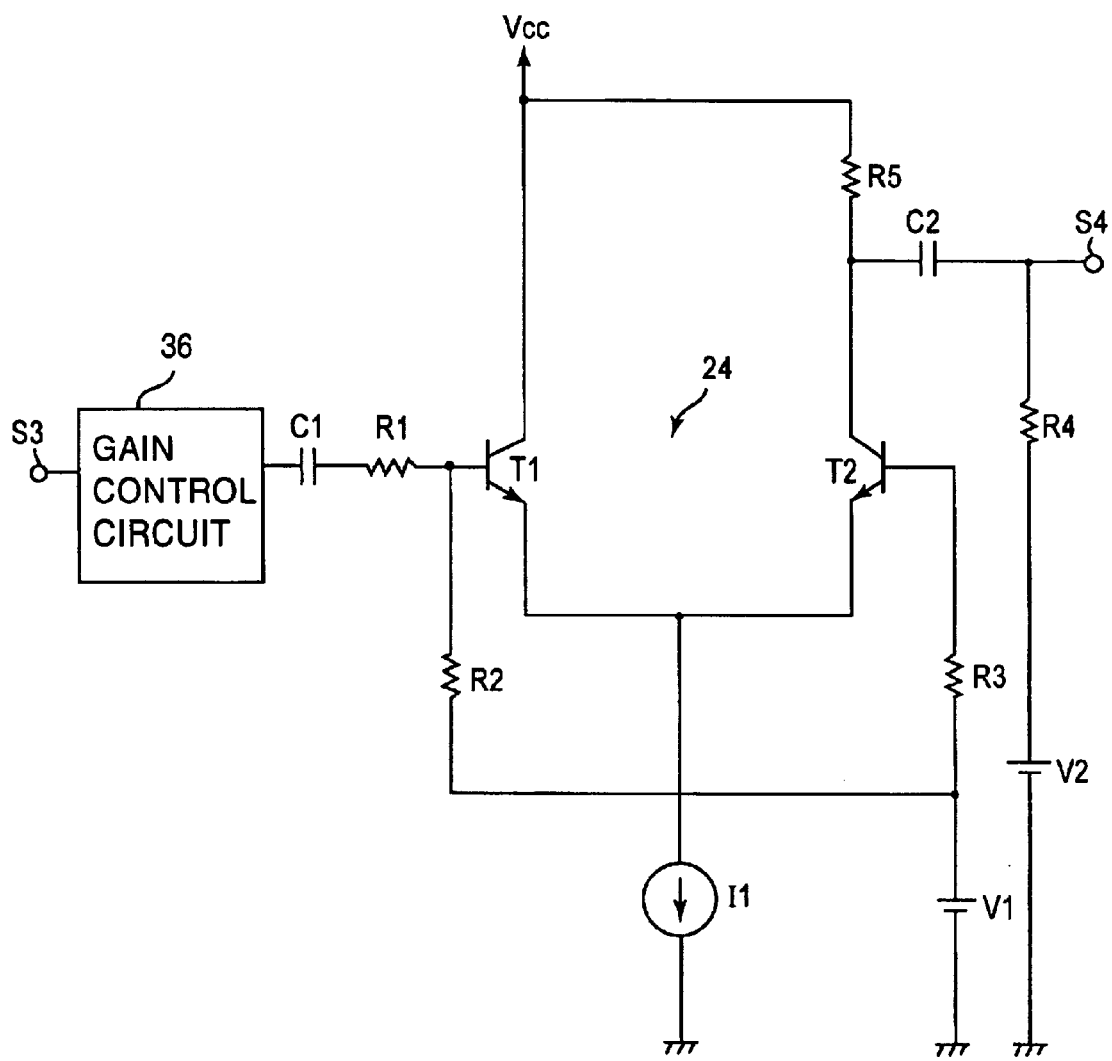
FIG. 20 is a circuit diagram showing a limiter used in the FIG. 18 embodiment.

FIG. 19 shows a structure of the level detector 34. An input terminal S5 is connected through a diode D1 to a base of a transistor T3 that is collector-grounded. A resistor R6 and a capacitor C3 are inserted in parallel between an output end of the diode D1 and the grounding. A resistor R7 is inserted between an emitted of the transistor T3 and a power supply VCC, and an output terminal S6 is connected to a connecting point between the resistor R7 and the emitter of the transistor T3. An extracted signal supplied from the BPF 12p to the input terminal S5 is subjected to have-wave rectification by the diode D1, and then smoothened by the resistor R6 and the capacitor C3. A smoothened voltage is supplied to the base of the transistor T3 so that a voltage corresponding to the extracted signal is outputted as a detected signal through the output terminal S6.

Figure 21:
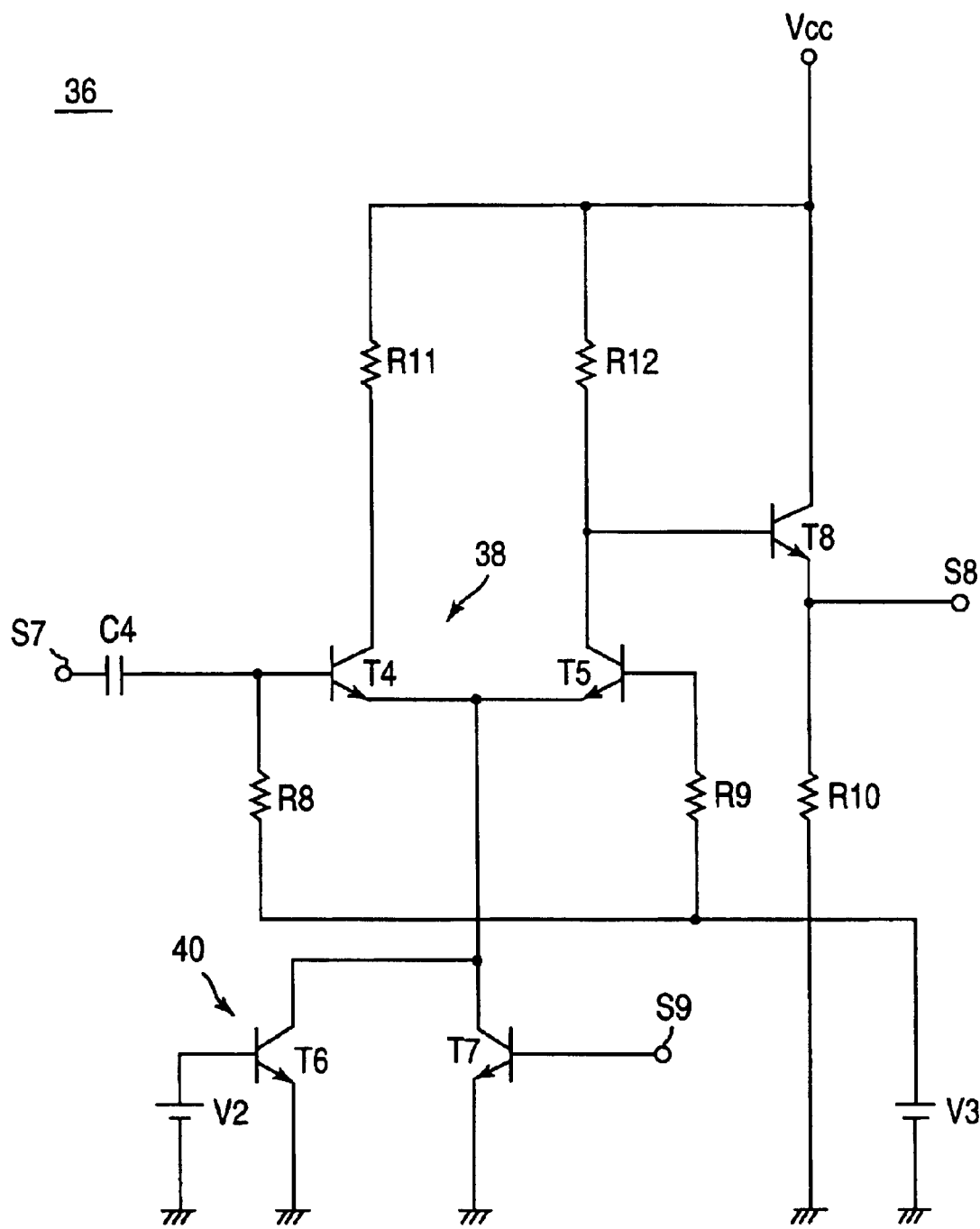
FIG. 21 is a circuit diagram showing a gain control circuit used in the FIG. 20 embodiment.

The limiter amplifiers 16a'–16n' have a gain control circuit 36 added between an input terminal S3 and a capacitor C1, as compared with the limiter amplifiers 16a–16n. This gain control circuit 36 is structured as shown in FIG. 21. An input terminal S7 is connected through a capacitor C4 to a base of a transistor T4 forming a differential pair 38. The base of the transistor T4 is also connected to a base of a transistor T5 through resistors R8 and R9, while the resistors R8 and R9 have therebetween a connecting point connected to a constant-voltage source V3. The transistor T4 has a collector connected to a power supply VCC through a resistor R11, while the transistor T5 has a collector connected to the power supply VCC through a resistor R12.

The collector of the transistor T5 is also connected to a base of a transistor T8 having a collector connected to the power supply VCC and an emitter being grounded through a resistor R10, wherein the emitter of the transistor T8 is connected to an output terminal S8. A connecting point between respective emitters of the transistor T4 and the transistor T5 is connected to collectors of transistors T6 and T7 included in a constant-current source 40, wherein the transistor T6 and the transistor T7 are grounded at their emitters. The transistor T6 has a base connected to a constant-voltage source V2, while the transistor T7 has a base connected to an input terminal S9 to receive a detected signal supplied from the level detector 34.

The constant-voltage source 40 is controlled in current amount by a level of a detected signal supplied from the level detector 34. That is, a total amount of an emitter current through the transistor T4 and an emitter current through the transistor T5 is determined by the detected signal, and the gain control circuit 36 is given a gain corresponding to a level of the detected signal. Therefore, if the detected signal has a high level, the limiter amplifiers 16a'–16n' become high in limiting level, while if the detected signal is low in level, the limiter amplifiers 16a'–16n' become low in limiting level.

Figure 22:
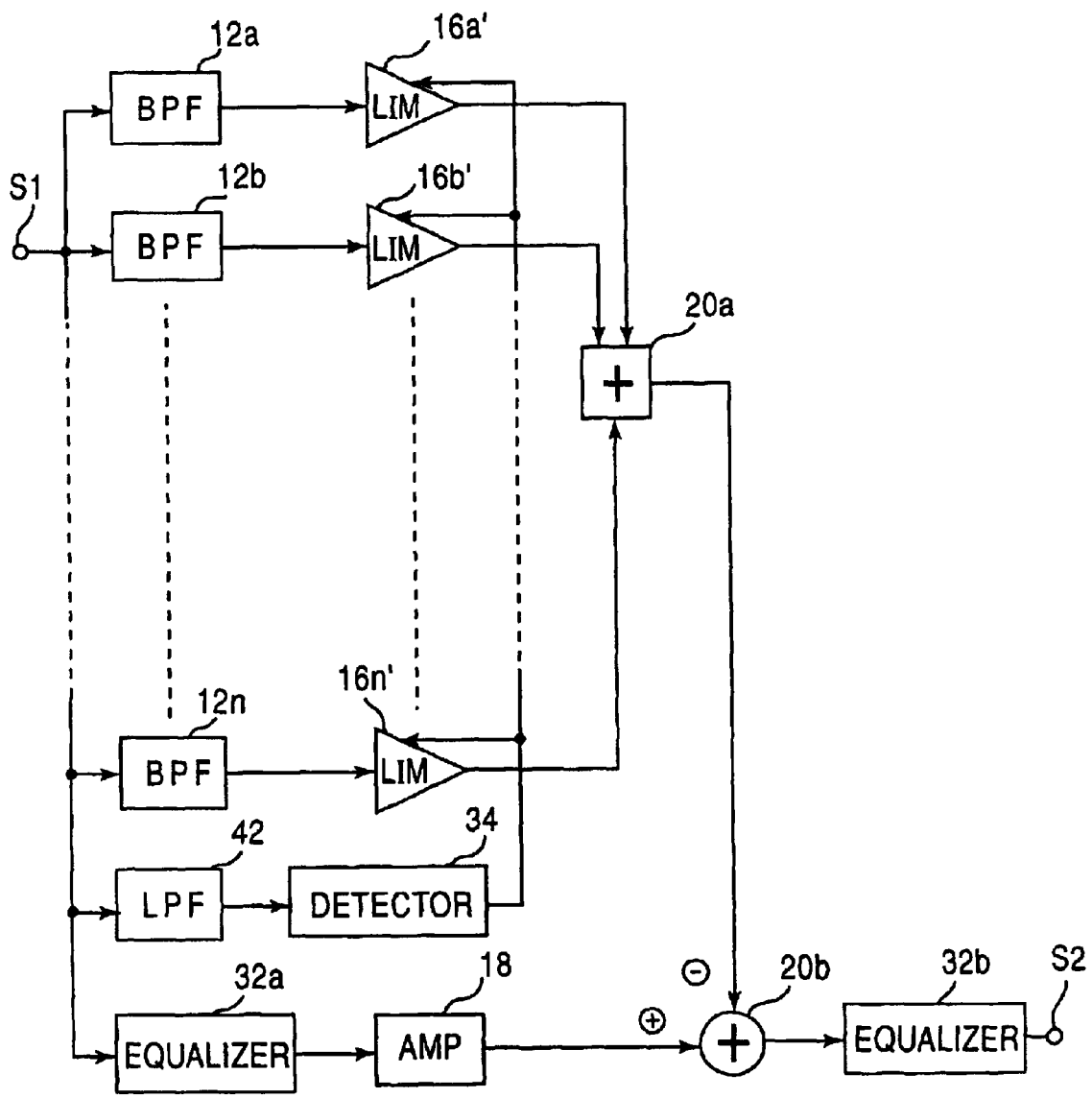
FIG. 22 is a block diagram showing another embodiment of this invention.

Referring to FIG. 22, a noise reducing circuit 10 in another embodiment is similar to the FIG. 18 embodiment except that the BPF 12p is replaced by an LPF 42 having a pass-band set lower than that of the BPF 12n, and the level detector 34 controls the limiter amplifiers 16a'–16n' based on an extracted signal extracted by the LPF 42. With this structure, the limiter amplifiers 16a'–16n' can be set in limiting level at optimal values.

Figure 23:
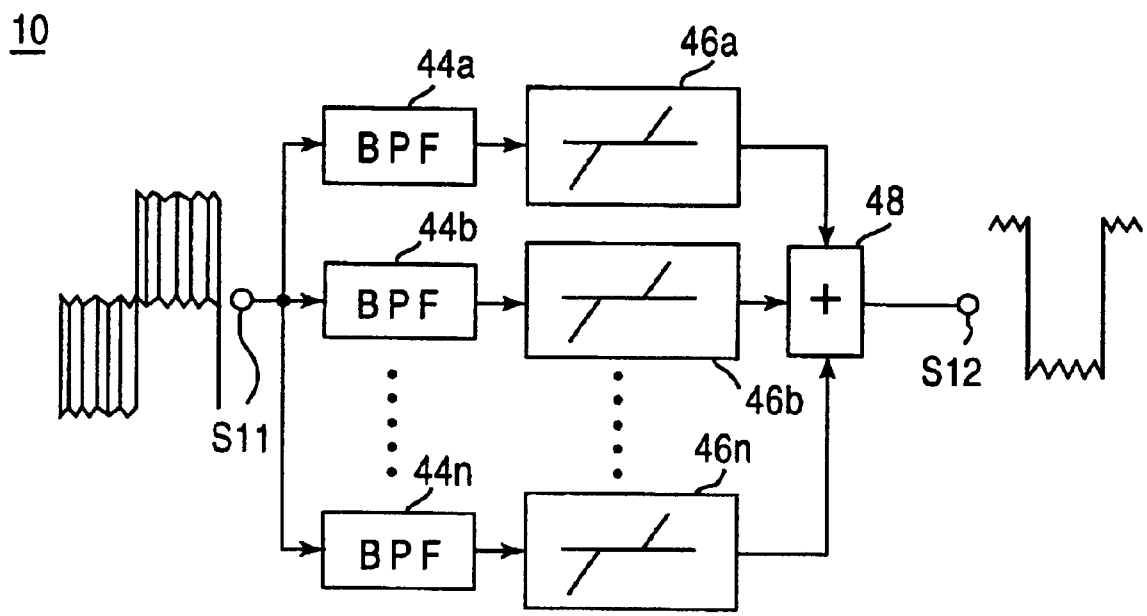
FIG. 23 is a block diagram showing another embodiment of this invention.

Referring to FIG. 23, a noise reducing circuit 10 in a still another embodiment includes an input terminal S11 to receive an luminance signal reproduced by a VTR (not shown). This luminance signal is supplied to BPF 44a–44n connected in parallel with each other and having a pass-band width broadened as the pass frequency range becomes higher so that predetermined frequency components are respectively extracted. The BPF 44a–44n are respectively connected with amplifiers 46a–46n so that extracted signals extracted by the BPF 44a–44n are amplified by them.

Figure 25:
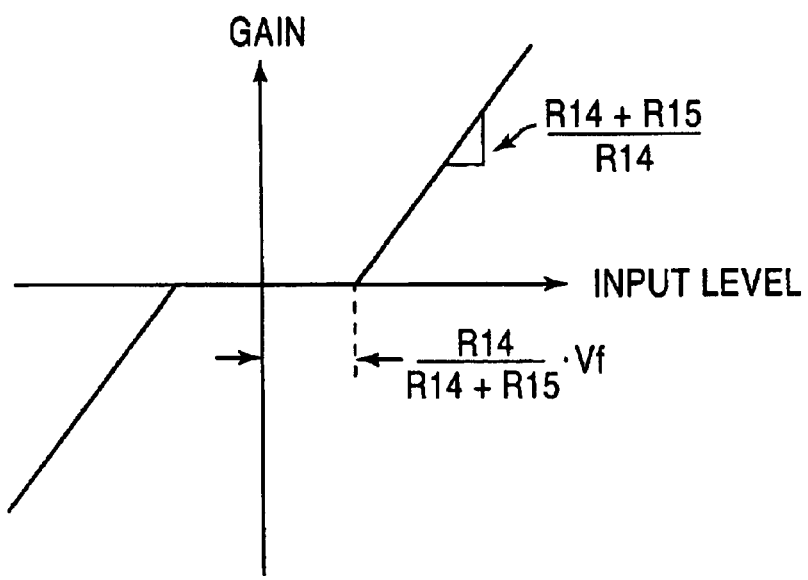
FIG. 25 is a graph showing a characteristic of the FIG. 24 embodiment.

The amplifiers 46a–46n have an amplifying characteristic, as shown in FIG. 25, that when an input level in absolute value exceeds a predetermined value, a gain suddenly increases in positive and negative directions. Consequently, if an adjustment is made for a range having a gain of 0, amplification is made only for a luminance signal component contained in the extracted signal inputted, thereby removing a noise component. Incidentally, the amplifiers 46a–46n are same in amplifying characteristic. The respective amplified signals from the amplifiers 46a–46n are added together by an adder 48 so that an addition signal, i.e. a luminance signal reduced of a noise component, is outputted through an output terminal S12.

Figure 24:
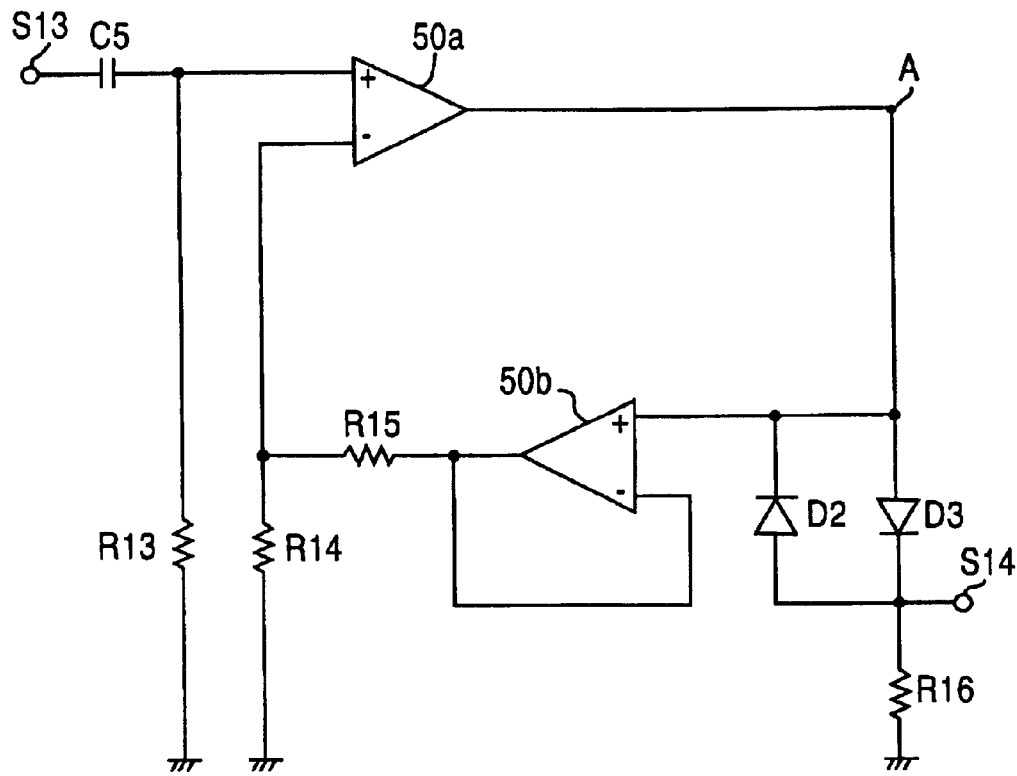
FIG. 24 is a circuit diagram showing one example of an example of an amplifier used in the FIG. 23 embodiment.
Figure 26:
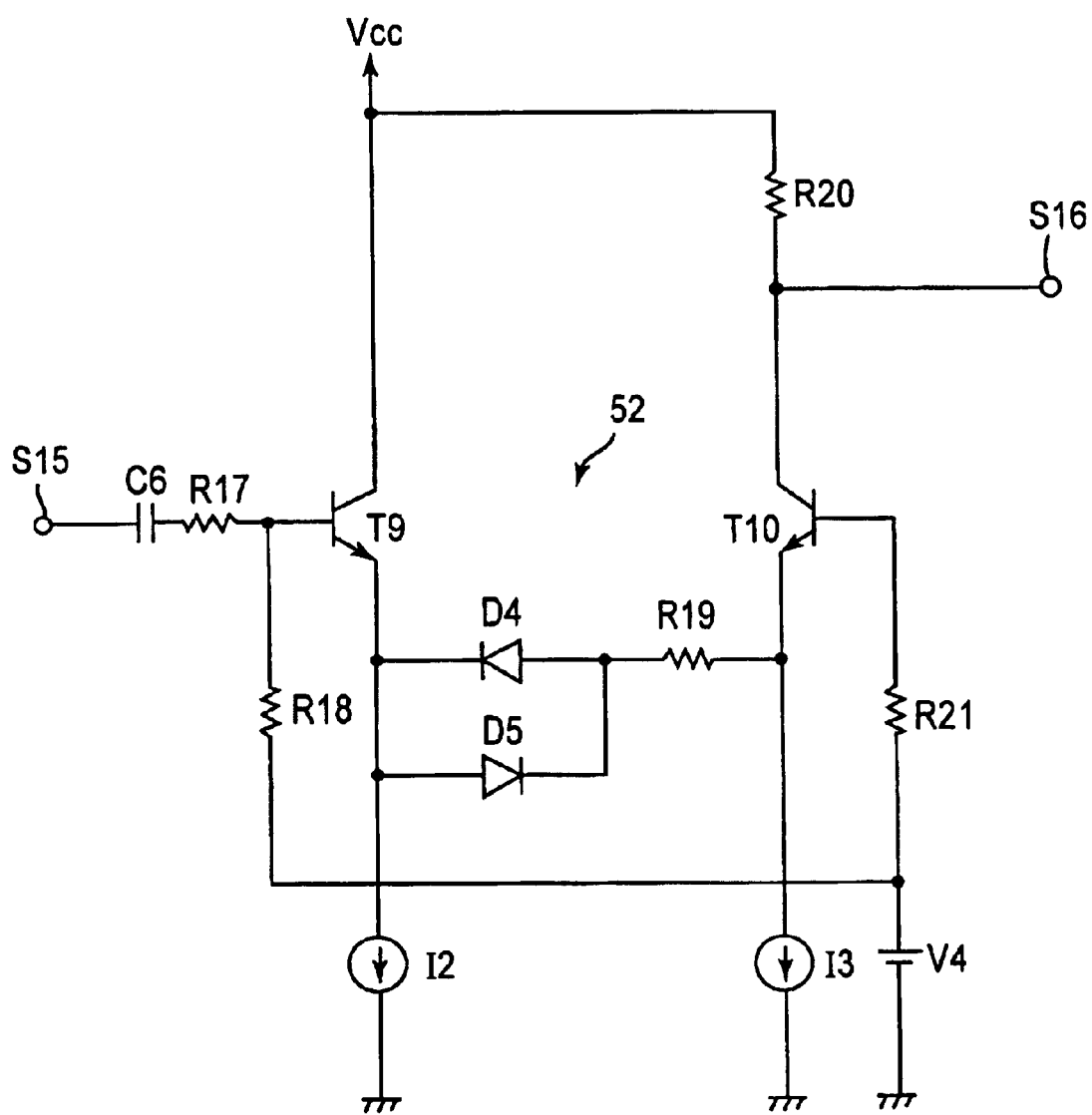
FIG. 26 is a circuit diagram showing another example of an amplifier used in the FIG. 23 embodiment.

The amplifiers 46a–46n are structured as shown in FIG. 24, That is, an input signal supplied through an input terminal S13 is inputted to a+terminal of an operational amplifier 50a through a capacitor C5 so that the operational amplifier 50a has an output to a+terminal of an operational amplifier 50b. The output of the operational amplifier 50b is divided by resistors R15 and R14 so that a terminal voltage of the resistor R14 is negatively fed back to an–terminal of the operational amplifier 50a. When the potential of a point a is smaller than a forward drop voltage Vf across diodes D2 and D3, the diodes D2 and D3 become non-conductive and nothing is outputted through an output terminal S14. However, where the potential of the point A is greater than the forward drop voltage Vf, any one of the diodes D2 and D3 is conductive. Accordingly, an amplified signal of approximately (R14+R15)/R14 times the input signal is obtained through an output terminal S14. Therefore, there is no amplification for a signal having a low level of a noise component, specifically a signal not greater than (R14+R15)×Vf as shown in FIG. 25. A signal having a greater noise component is amplified by (R14+R15)/R14 times and outputted. Incidentally, the amplifiers 46a–46n may be structured as shown in FIG. 26. According to FIG. 26, an input terminal S15 is connected through a capacitor C6 and a resistor R17 to a base of a transistor T9 forming a differential pair 52. Also, the transistor T9 has a base connected through resistors R18 and R21 to a base of a transistor T10. The resistors R18 and R21 have therebetween a connecting point connected to a constant-voltage source V4. The transistor T9 has a collector connected to a power supply VCC, and an emitter connected through a diode D4 and a resistor R19 to an emitter of the transistor T10. The diode D5 is directed in a reverse direction to the diode D4 and connected in parallel with the diode. The emitter of the transistor T9 is also connected to a constant current source I2, while the emitter of the transistor T10 is connected to a constant-current source I3. The transistor T10 has a collector connected through a resistor R20 to the power supply VCC and directly to an output terminal S16.

When the terminal voltage of the diodes D4 and D5 is lower than the forward drop voltage Vf of the diodes D4 and D5, the diodes D4 and D5 are not conductive and hence the differential pair 52 is not operative so that nothing is outputted through an output terminal S16. On the other hand, if the terminal voltage of the diodes D4 and D5 is greater than the forward drop voltage Vf, the diodes D4 and D5 are conductive and the differential pair 52 is operative so that an amplified signal is obtainable through the output terminal S16. Here, where a noise component only or the like is inputted through the input terminal S15, the diodes D4 and D5 are not conductive and the differential pair is inoperative. Therefore, an amplified signal reduced of a noise component is outputted through the output terminal 36.

Figure 27:
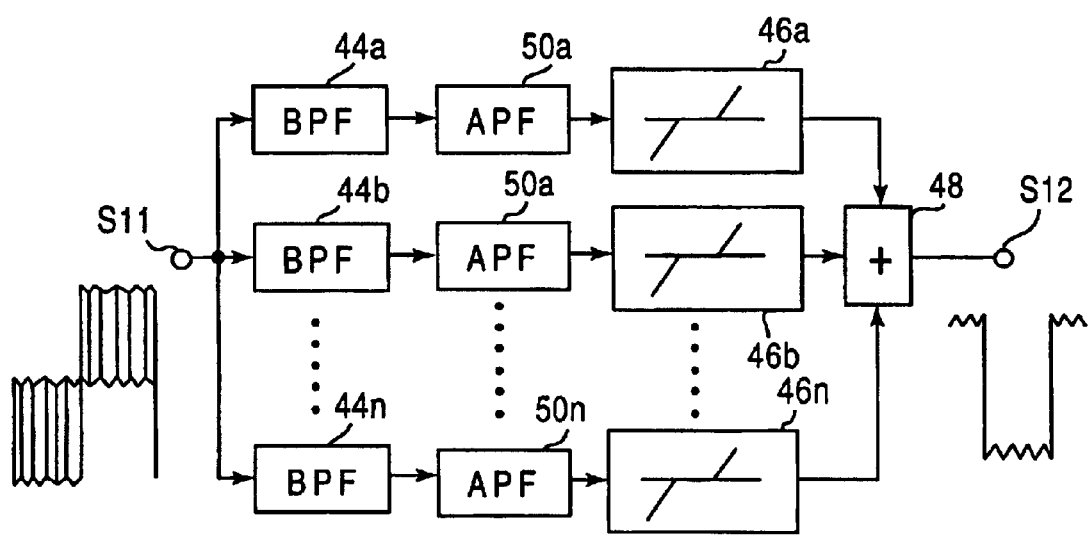
FIG. 27 is a block diagram showing another embodiment of this invention.

Referring to FIG. 27, a noise reducing circuit 10 in another embodiment is similar to the FIG. 23 embodiment except that the BPF 44a–44n have a same pass-band width, and APFs (all-pass filters) 50a–50n are individually inserted respectively between the BPFs 44a–44n and the amplifiers 46a–46n, omitting duplicated explanations. Due to the same pass-band width of the BPFs 44a–44n, the respective BPFs have delay characteristics different from one another as shown in FIG. 9(B). Accordingly, the APFs 50a–50n are provided in order to match the phase of the extracted signals from the BPFs 44a–44n. This makes it possible to obtain a luminance signal free of phase deviation from an adder 48.

Figure 28:
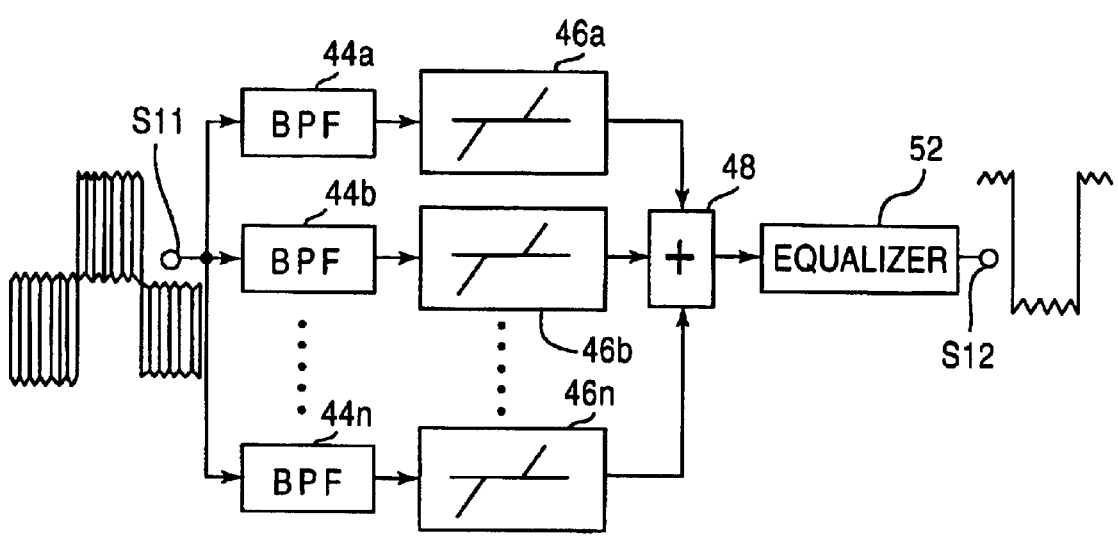
FIG. 28 is a block diagram showing another embodiment of this invention.

Referring to FIG. 28, a noise reducing circuit 10 in another embodiment is similar to the FIG. 23 embodiment except that an equalizer 52 is inserted between the adder 48 and the output terminal S12. This equalizer 52 is to collect deviation in phase for respective extracted signals outputted from the BPF 44a–44n. This makes it possible to create a luminance signal with high fidelity.

Figure 29:
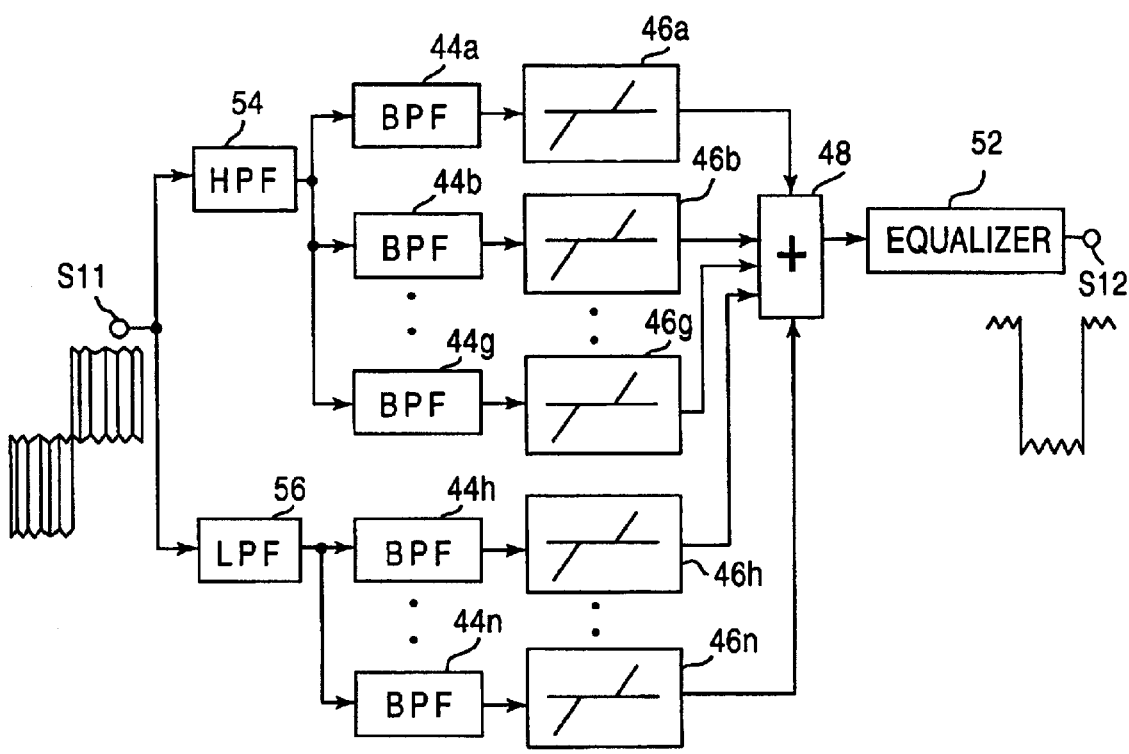
FIG. 29 is a block diagram showing another embodiment of this invention.

Referring to FIG. 29, a noise reducing circuit 10 in still another embodiment is similar to the FIG. 28 embodiment except that an HPF 54 is inserted between the BPF 44a–44g and the input terminal S11, and a LPF 56 is inserted between the BPFs 44h–44n and the input terminal S11. The HPF 54 has a pass band covering a pass band for the BPF 44a–44g, while the LPF 56 has a pass band covering pass-bands of the BPFs 44h–44n. The band range is divided by the HPF 54 and the LPF 56 in this manner. Accordingly, even when inputting a luminance signal having a broader band than a dynamic range of the transistors forming the BPF 44a–44n, there is no possibility that the transistor is saturated.

Figure 30:
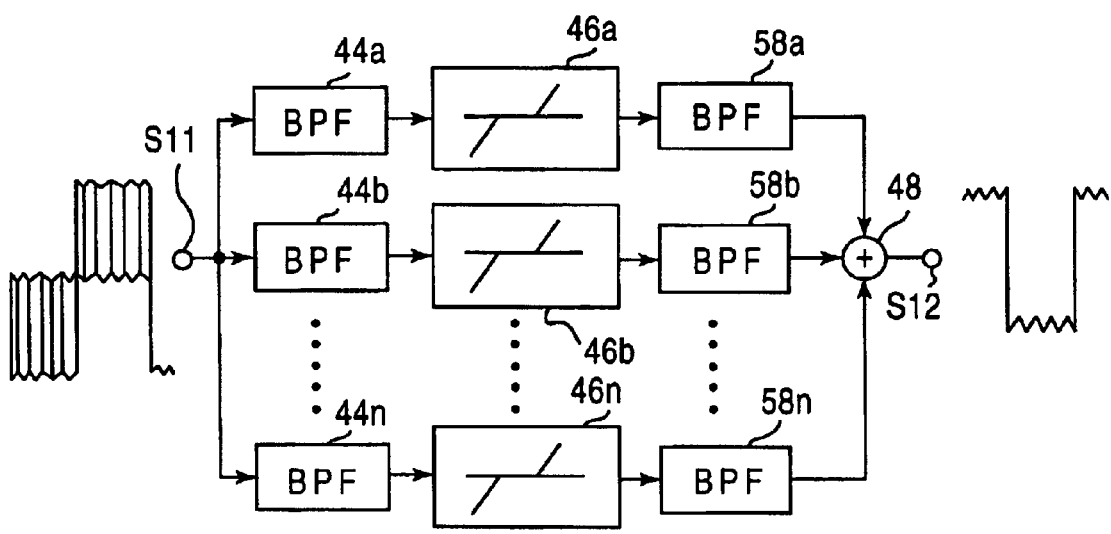
FIG. 30 is a block diagram showing a further embodiment of this invention.
Figure 31:
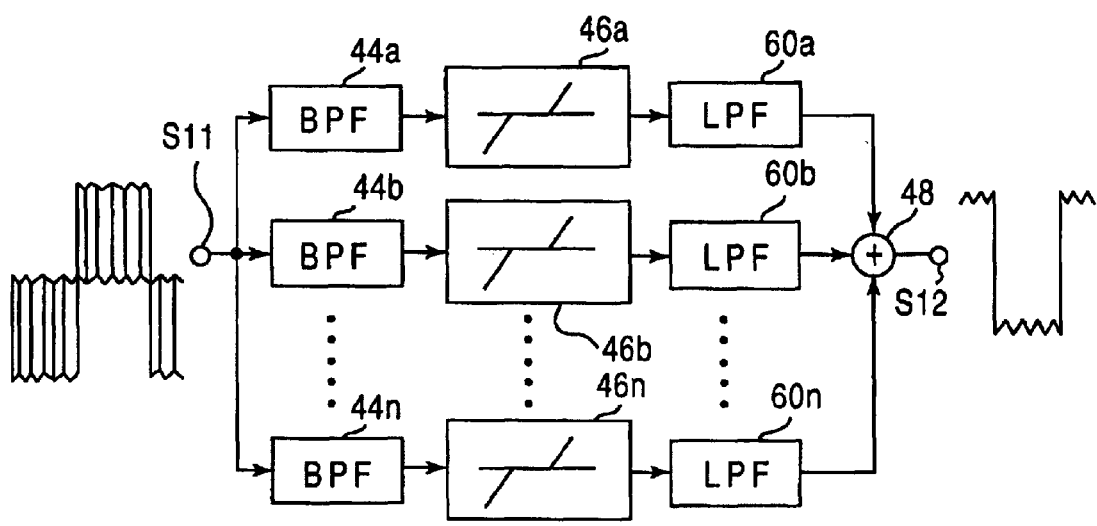
FIG. 31 is a block diagram showing still another embodiment of this invention.

Referring to FIG. 30, a noise reducing circuit 10 in another embodiment is similar to the FIG. 23 embodiment except that BPFs 58a–58n are individually inserted between the respective amplifiers 46a–46n and the adder 48. The BPFs 58a–58n are filters to remove higher harmonics caused by the limiters 46a–46n. Thus a luminance signal free of both noise and higher harmonics is obtainable from the adder 48. Incidentally, it is possible to remove higher harmonics by providing LPFs 60a–60n in place of the BPFs 58a–58n, as in a noise reducing circuit 10 shown in FIG. 31.

Figure 32:
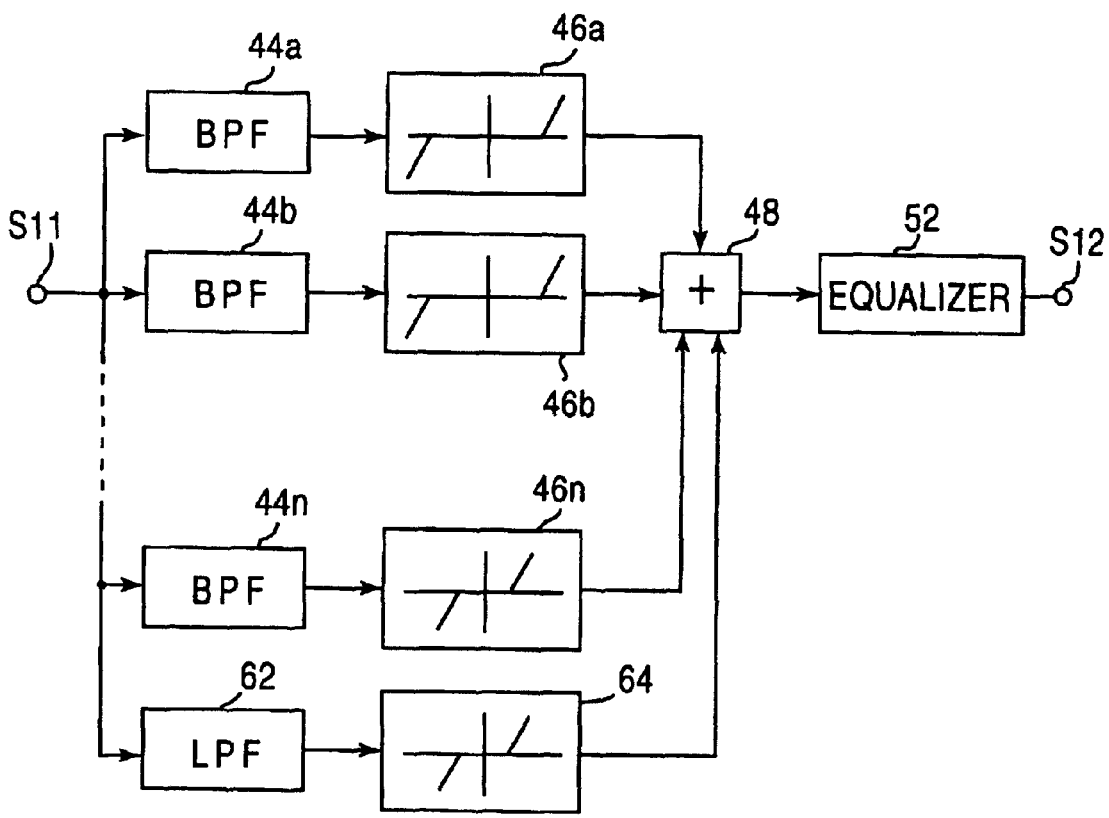
FIG. 32 is a block diagram showing another embodiment of this invention.
Figure 33:
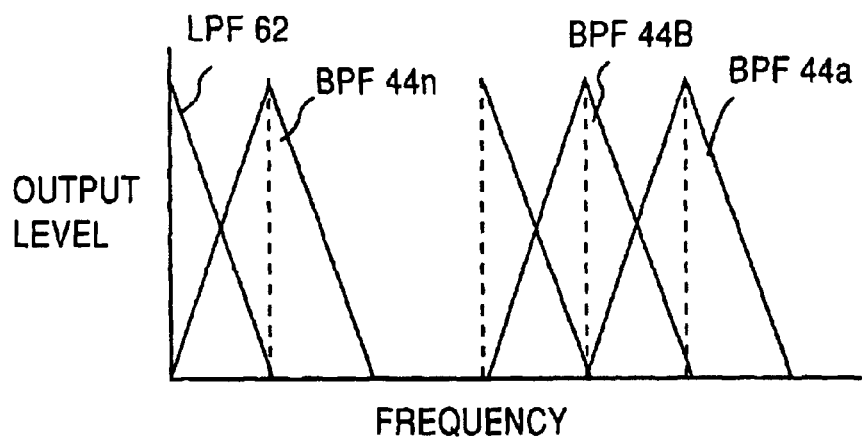
FIG. 33 is an illustrative view showing passbands of a plurality of BPFs used in the FIG. 32 embodiment.
Figure 34:
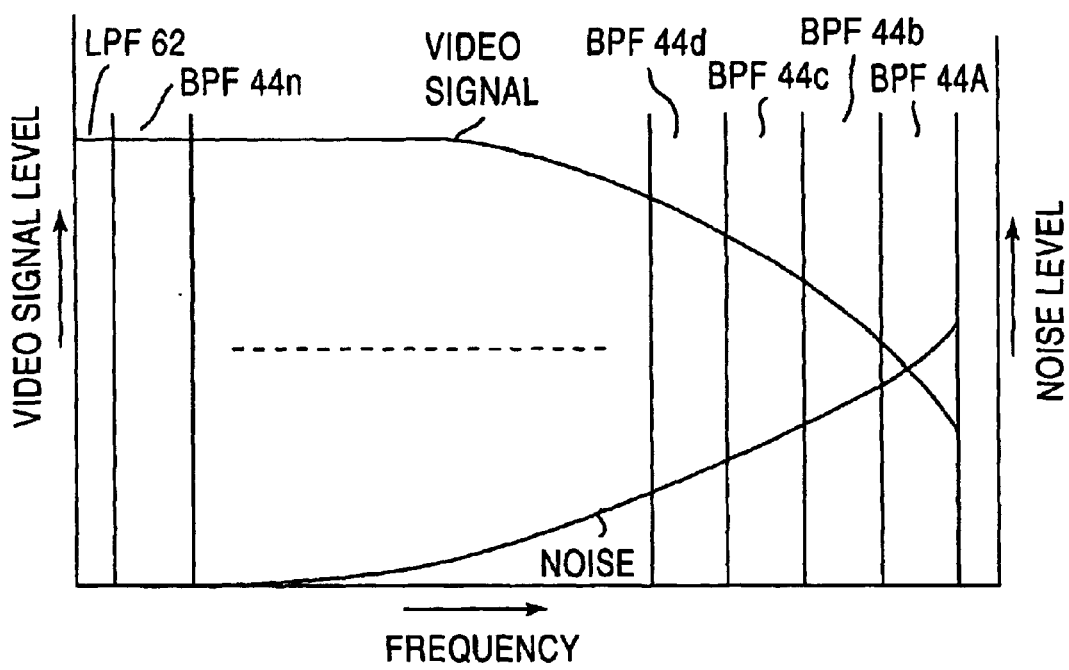
FIG. 34 is a graph showing frequency characteristics of a video signal and noise.

Referring to FIG. 32, a noise reducing circuit 10 in a further embodiment is similar to the FIG. 28 embodiment except that the amplifiers 46a–46n have different characteristics from one another, and an LPF 62 having a lower pass-frequency range band than the BPF 44n and an amplifier 64 are inserted between the input terminal S11 and the adder 48. As shown in FIG. 34, the luminance signal given to the input terminal S11 has a characteristic that decreases in level as the frequency becomes higher. The noise contained in this luminance signal has a characteristic that increases in level as the frequency becomes higher. Due to this, the extracted signal extracted from the BPFs has a noise component increasing in a direction from the BPF 44n to the BPF 44a. This is, although the noise component is considerably low as compared with the level of a video signal, the noise component extracted by the BPF 44a or 44b is greater than the noise component extracted by the BPF 44n or LPF 62.

Due to this, the range in which the gain possessed by the amplifiers 46a–46n and 64 assumes 0 or the slight, corresponds to a noise component, i.e. a noise level, to be extracted. That is, the range of a gain of 0 set in the amplifier becomes broader in a direction form the amplifier 64 to amplifier 46a. Accordingly, although the amplifiers 46a and 46b are given much noise, only the luminance signal is amplified without amplifying the noise. This enables noise to be fully reduced.

Figure 35:
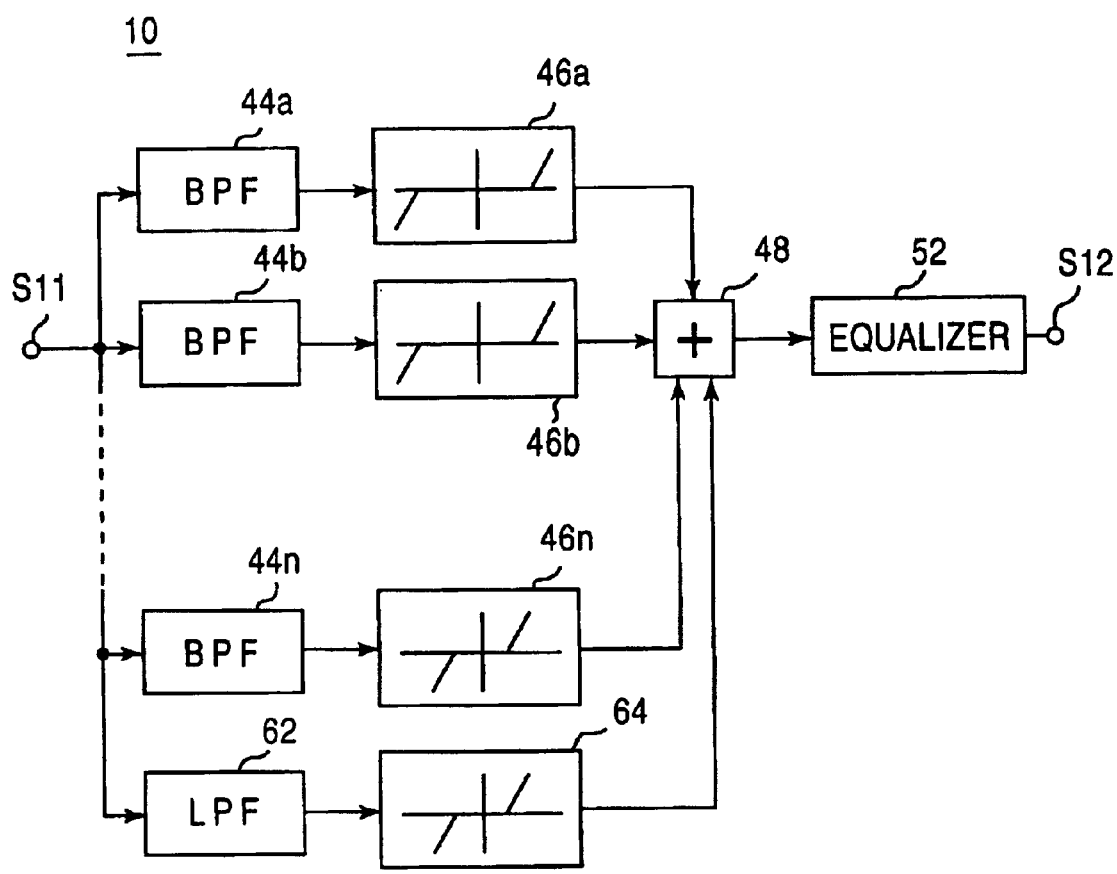
FIG. 35 is a block diagram showing another embodiment of the FIG. 1 embodiment.
Figure 36:
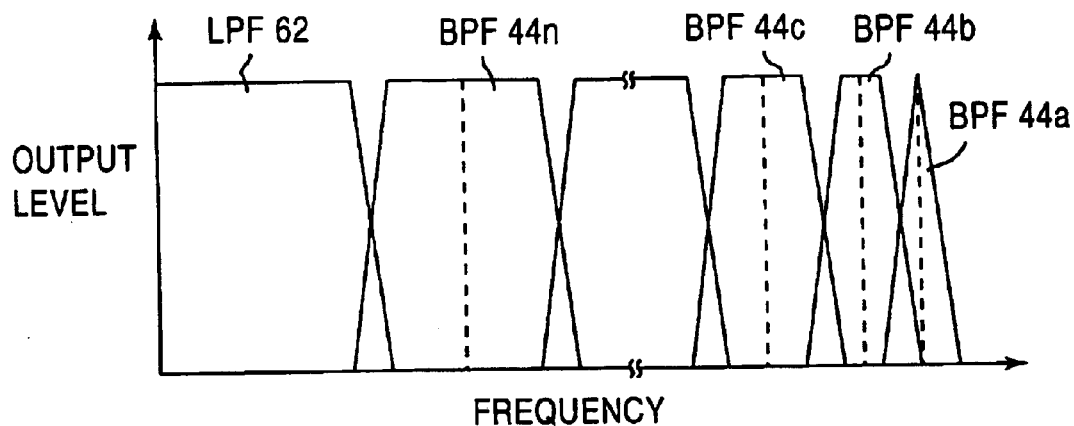
FIG. 36 is an illustrative view showing pass bands of a plurality of BPFs and LPFs used in the FIG. 35 embodiment.
Figure 37:
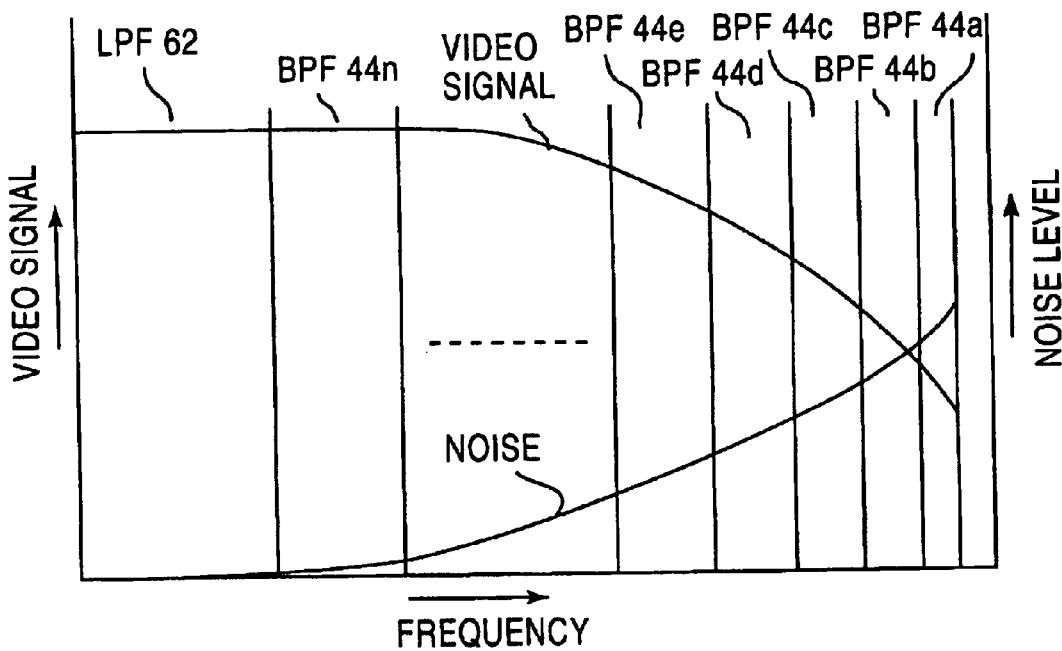
FIG. 37 is a graph showing frequency characteristics of a video signal and noise.

Referring to FIG. 35, a noise reducing circuit in another embodiment is similar to the FIG. 32 embodiment except that the BPFs 44a–44n and the LPF 62 have pass bands as shown in FIG. 36 and FIG. 37. The BPFs 44a–44n and the LPF 62 are different in pass-band width from one another, wherein the pass band width becomes narrower as the pass-frequency range becomes higher, i.e. in a direction from the LPF 62 to the BPF 44a. In other words, the pass-band width becomes narrower with increase in noise level in the pass band. The narrowing of the pass-band width at higher range in this manner can improve the higher-range S/N for the extracted signal by the BPF, as understood from FIG. 37. Accordingly, the noise given to the amplifiers 46a and 46b is reduced. It is possible to positively reduce the noise in concert with the characteristics of amplifiers 46a–46n and 64, correspondingly to the noise level.

Figure 38:
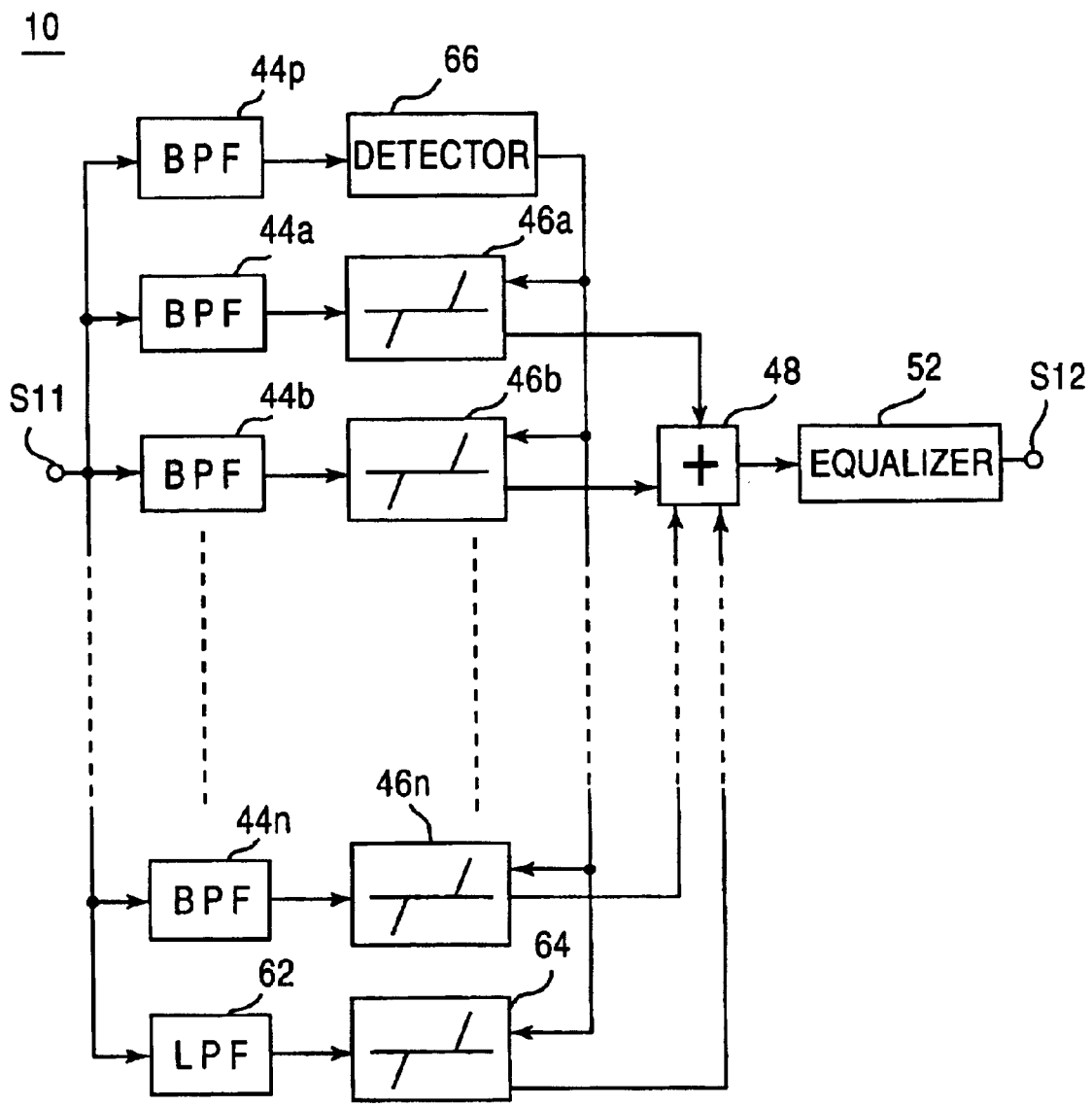
FIG. 38 is a block diagram showing still another embodiment of this invention.
Figure 39:
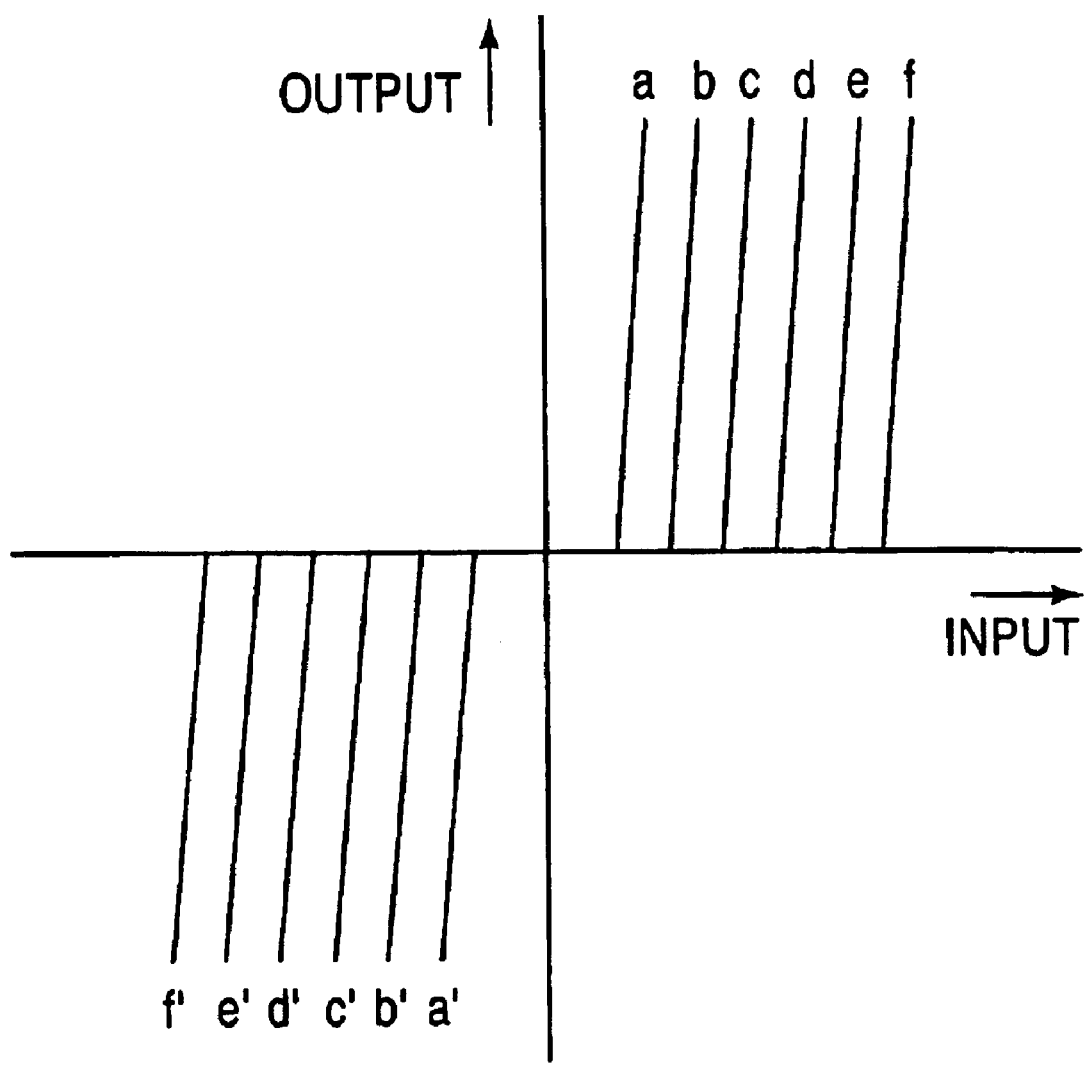
FIG. 39 is a graph showing a characteristic of an amplifier used in the FIG. 38 embodiment.

Referring to FIG. 38, a noise reducing circuit 10 in another embodiment is similar to the FIG. 32 embodiment except that there are added therein a BPF 44p having the same pass band as the BPF 44a and a level detector 66 to detect a level of an extracted signal extracted by the BPF 44p, and the amplifiers 46a–46n and 64 are same in characteristic so that the characteristic is controlled by a detected signal by the level detector 66. The characteristic of the amplifier 46a–46n or 64 is switched between characteristic lines a—a', b—b', c—c', d—c', e—e' and f—f'. Since the luminance signal given to the input terminal S11 and the noise contained therein have a characteristic as shown in FIG. 34, it is possible to presume at what level the luminance signal and the noise reside, by detecting a level of an extracted signal by the BPF 44. This makes possible to set the characteristics of the amplifiers 46a–46n and 64 at optimal values. Due to this, a video signal fully reduced of noise can be obtained from the adder 48.

Figure 40:
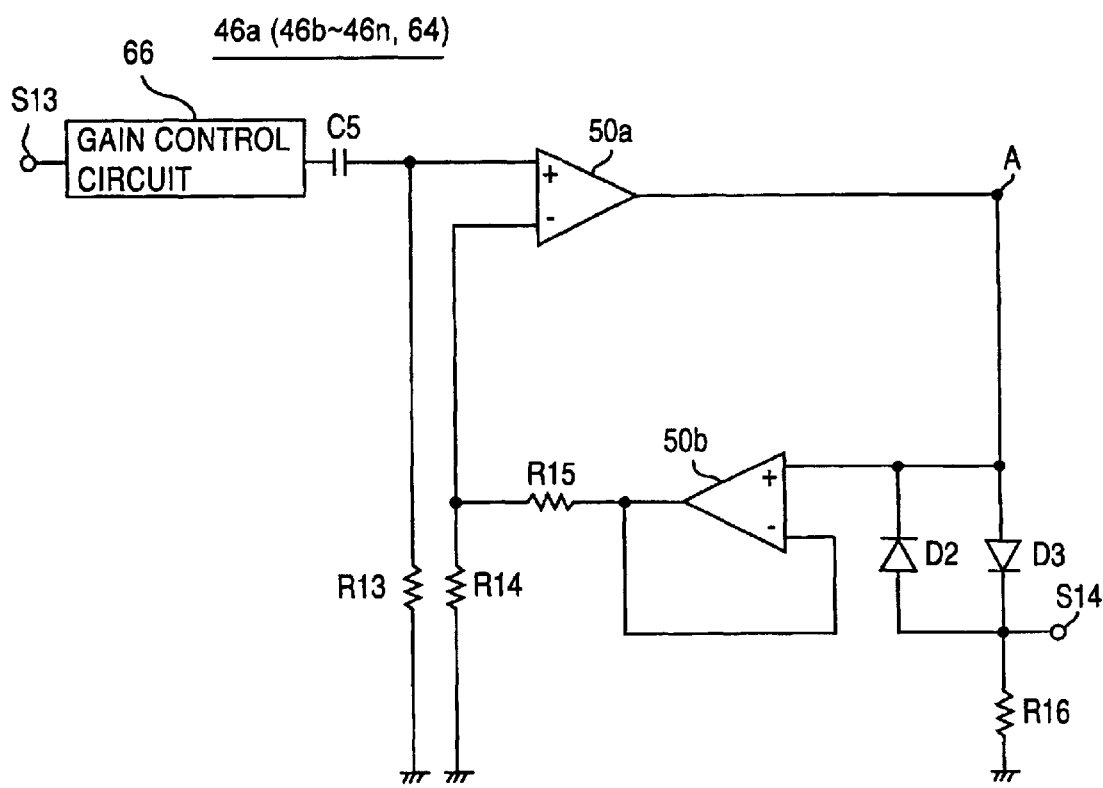
FIG. 40 is a circuit diagram showing one example of an amplifier used in the FIG. 38 embodiment.

The amplifiers 46a–46n and 64, as understood from FIG. 40, are similar to the amplifiers 46a–46n shown in FIG. 24 except that a gain control circuit 66 is inserted between the input terminal S13 and a capacitor C5. Also, the gain control circuit 66 is similarly structured to the gain control circuit 36 shown in FIG. 21.

Figure 41:
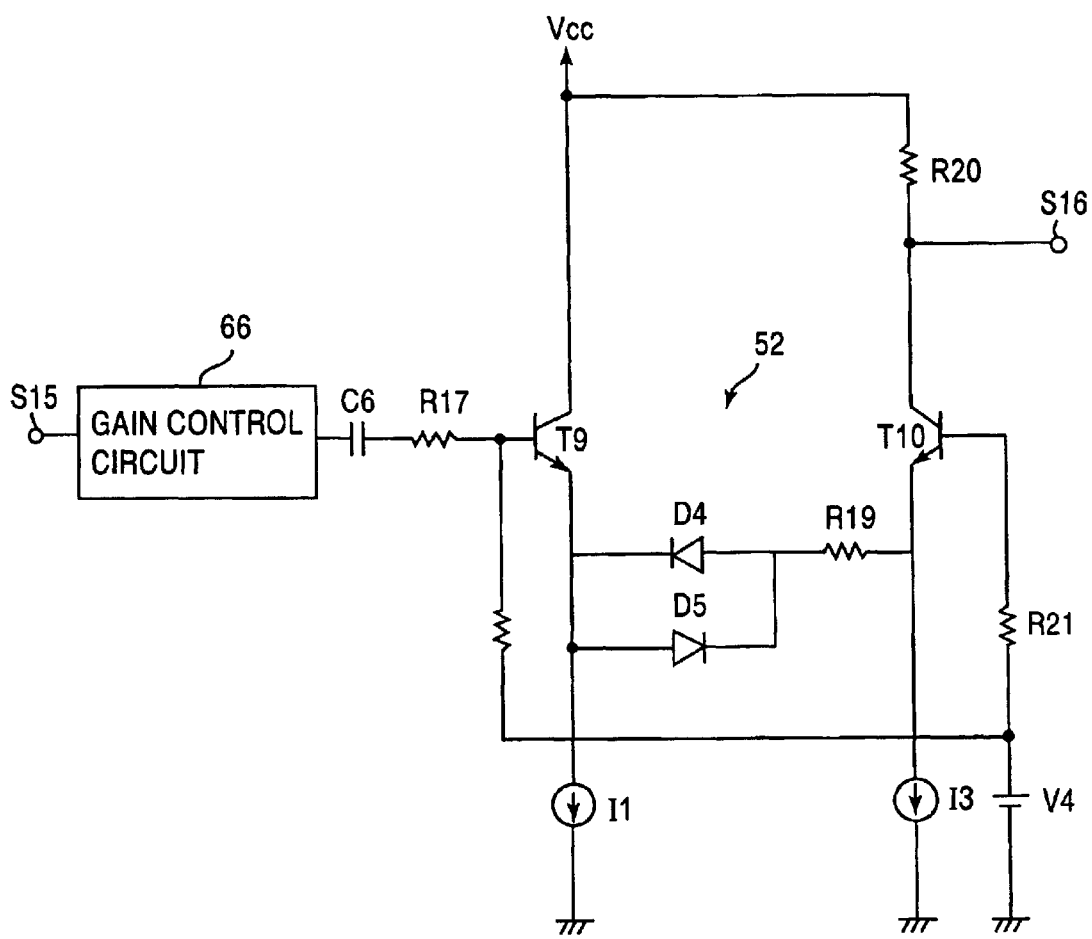
FIG. 41 is a circuit diagram showing another example of an amplifier used in the FIG. 39 embodiment.

Incidentally, the amplifiers 46a–46n and 64 may use those shown in FIG. 41. These amplifiers 46a–46n and 64 are the same as the amplifiers 46a–46n excepting that the gain control circuit 66 is inserted between the input terminal S15 and the capacitor C6, omitting duplicated explanations.

Figure 42:
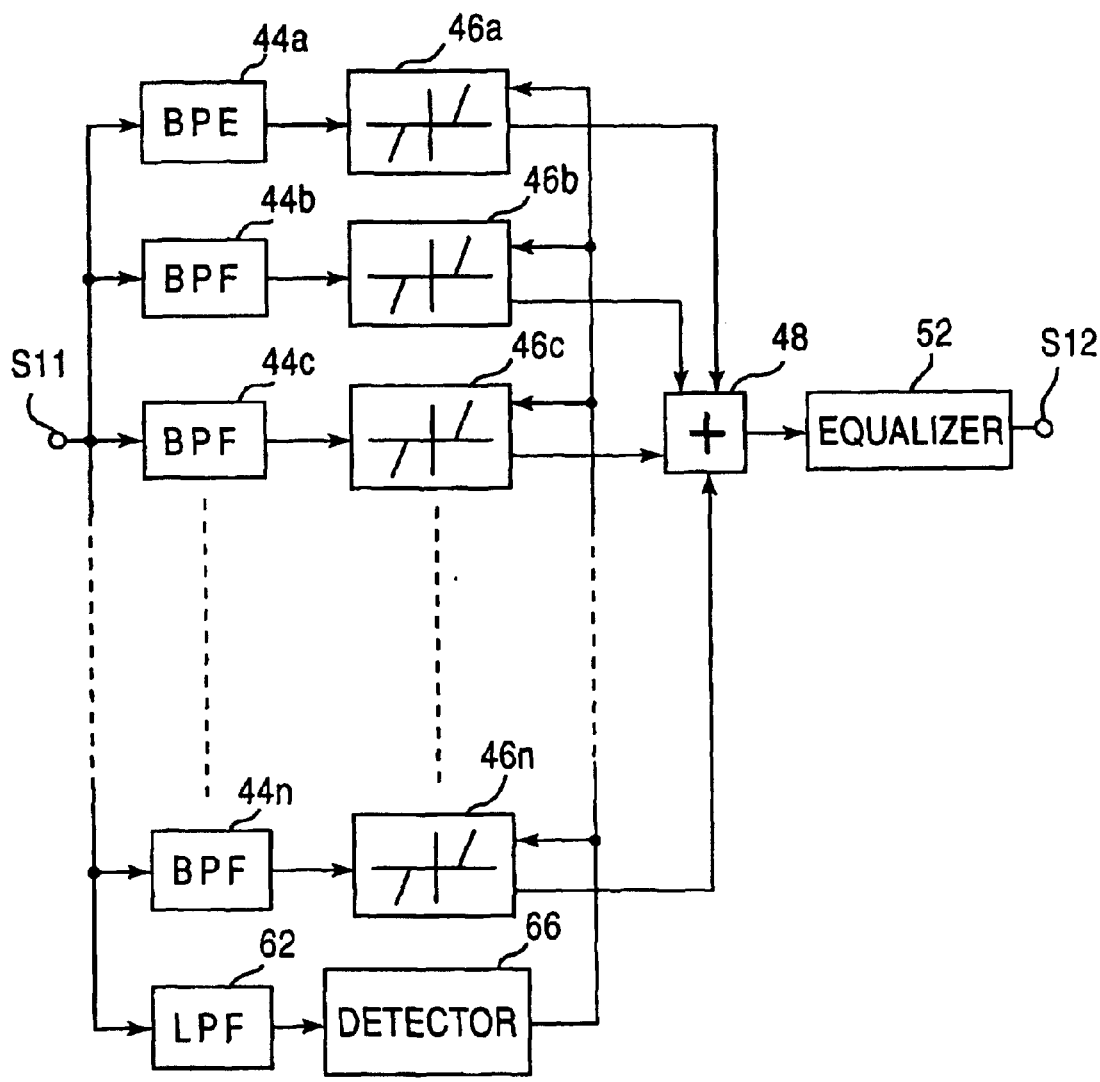
FIG. 42 is a block diagram showing another embodiment of this invention.
Figure 43:
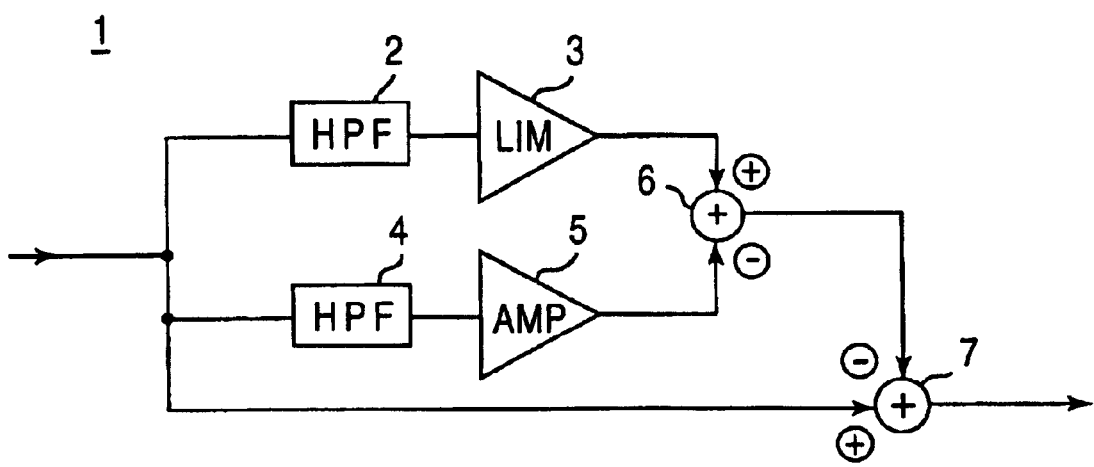
FIG. 43 is a block diagram showing a conventional art.
Figure 44A:
FIG. 44 is a timing chart showing part of operation in the prior art shown in FIG. 43.
Figure 44B:
Figure 44C:
Figure 44D:
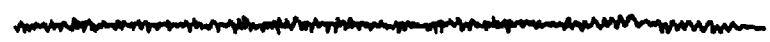
Figure 44E:
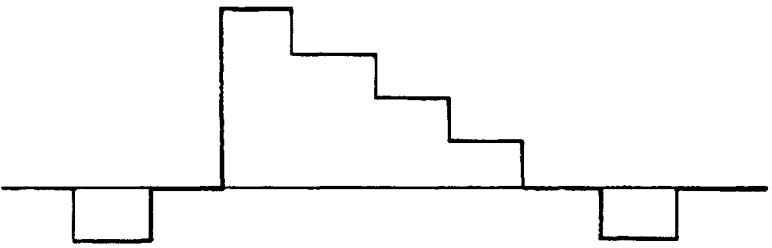

Incidentally, the level of an extracted signal by the LPF 62 may be detected by the level detector 66 as shown in FIG. 42 so that the amplifiers 46a–46n are controlled in characteristic by the detected signal.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A noise reducing circuit comprising:
   a first signal path for receiving an input signal and outputting a noise component contained in the input signal;
   a second signal path for receiving the input signal and outputting a first correlating signal correlating to the input signal; and
   a first calculating means for calculating the noise component outputted from said first signal path and the input signal to reduce noise,
   wherein said first signal path includes a plurality of bandpass filters for extracting a plurality of first predetermined frequency components contained in the input signal, a plurality of limiters for individually receiving outputs of said bandpass filters, and a first creating means for creating the noise component based on outputs of said limiters,
   wherein said first creating means includes a second correlating signal creating means for creating a second correlating signal correlating to the input signal, and a second calculating means for subtracting the second correlating signal at least from second predetermined frequency components in the outputs of said limiters, and
   wherein said second calculating means includes a first adding means for adding the second predetermined frequency components together, and a first subtracting means for subtracting the second correlating signal from a first additional signal outputting from said first adding means.

2. A noise reducing circuit according to claim 1, further comprising a higher-harmonics removing means for removing higher harmonics from the outputs of said limiters.

3. A noise reducing circuit according to claim 2, wherein said higher-harmonic removing means includes a plurality of filters for individually receiving the outputs of said limiters and removing the high harmonics.

4. A noise reducing circuit according to claim 2, wherein said high-harmonic removing means includes a second adding means for adding parts of the outputs of said limiters together, a third adding means for adding other parts of the outputs of said limiters, a first filter for removing higher harmonics contained in a second addition signal outputting from said second adding means, and a second filter for removing higher harmonics contained in a third addition signal outputted from said third adding means.

5. A noise reducing circuit according to claim 1, wherein said bandpass filters have the same pass-band width, said first signal path further including a phase adjusting means for adjusting in phase the first predetermined frequency components.

6. A noise reducing circuit according to claim 5, wherein said phase adjusting means adjusts the phase depending upon respective delay characteristics of said bandpass filters.

7. A noise reducing circuit according to claim 1, wherein said second correlating signal creating means includes a level adjusting means for adjusting a level of a third predetermined frequency component contained in the input signal and creating the second correlating signal having a predetermined relation in level to limiting levels of said limiters.

8. A noise reducing circuit according to claim 7, wherein said second creating means further includes a first delay means for matching in phase the second correlating signal created by said adjusting means to a phase of the second predetermined frequency component.

9. A noise reducing circuit according to claim 8, wherein said second signal path includes a second delay means for matching the phase of the input signal to a phase of the noise component outputted from said first subtracting means.

10. A noise reducing circuit according to claim 1, wherein said first calculating means includes a second subtracting means for subtracting the noise component from the input signal.

11. A noise reducing circuit according to claim 1, wherein said first creating means includes an adding means for adding the output of limiters together to create the noise component, said second path including a filter for extracting the second predetermined frequency components of the input signal, and said first calculating means receiving the second predetermined frequency components of the input signal as the first correlating signal and subtracting the noise component from the first correlating signal.

12. A noise reducing circuit according to claim 1, wherein said second-pass filters each have a narrower pass-band width as a noise component level in the pass band becomes greater.

13. A noise reducing circuit according to claim 12, wherein said limiters have a same limiting characteristic.

14. A noise reducing circuit according to claim 13, further comprising a control means for controlling characteristics of limiters in response to a level of the input signal.

15. A noise reducing circuit according to claim 14, wherein said control means includes a first for extracting the second predetermined frequency components of the input signal, and a control signal creating means for creating a control signal for said limiters depending upon an output of said filter.

16. A noise reducing circuit according to any of claim 12 to 15, wherein said second signal path includes a first phase adjusting means for adjusting respective phases of the first predetermined frequency components contained in the input signal, and said first calculating means receiving the input signal adjusted in phase as the first correlating signal.

17. A noise reducing circuit according to claim 16, wherein said first phase adjusting means adjusts the phases depending upon respective delay characteristics of said bandpass filters.

18. A noise reducing circuit according to claim 16, further comprising a second phase adjusting means for returning back deviations of the phases of the first predetermined frequency components contained in the output of said first calculating means.

19. A noise reducing circuit comprising:
- a first signal path for receiving an input signal and outputting a noise component contained in the input signal;
- a second signal path for receiving the input signal and outputting a first correlating signal correlating to the input signal; and
- a first calculating means for calculating the noise component outputted from said first signal path and the input signal to reduce noise,
- wherein said first signal path includes a plurality of bandpass filters for extracting a plurality of first predetermined frequency components contained in the input signal, a plurality of limiters for individually receiving outputs of said bandpass filters, and a first creating means for creating the noise component based on outputs of said limiters, and
- wherein said bandpass filters each have a pass-band width broadened as the pass-frequency band becomes higher.

* * * * *